United States Patent
Ogashiwa et al.

(10) Patent No.: US 12,134,696 B2
(45) Date of Patent: Nov. 5, 2024

(54) RESIN COMPOSITION, PREPREG, RESIN SHEET, LAMINATE, METAL FOIL-CLAD LAMINATE, AND PRINTED WIRING BOARD

(71) Applicant: MITSUBISHI GAS CHEMICAL COMPANY, INC., Tokyo (JP)

(72) Inventors: Takaaki Ogashiwa, Tokyo (JP); Tetsuro Miyahira, Tokyo (JP); Tatsuro Takamura, Tokyo (JP); Sayaka Ito, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 18/276,539

(22) PCT Filed: Jan. 26, 2022

(86) PCT No.: PCT/JP2022/002836
§ 371 (c)(1),
(2) Date: Aug. 9, 2023

(87) PCT Pub. No.: WO2022/172752
PCT Pub. Date: Aug. 18, 2022

(65) Prior Publication Data
US 2024/0043687 A1 Feb. 8, 2024

(30) Foreign Application Priority Data
Feb. 10, 2021 (JP) ................. 2021-020067

(51) Int. Cl.
| | |
|---|---|
| *C08L 79/08* | (2006.01) |
| *C08J 5/18* | (2006.01) |
| *C08J 5/24* | (2006.01) |
| *C08K 3/22* | (2006.01) |
| *C08K 7/18* | (2006.01) |
| *H05K 1/03* | (2006.01) |

(52) U.S. Cl.
CPC ............... *C08L 79/08* (2013.01); *C08J 5/18* (2013.01); *C08J 5/244* (2021.05); *C08J 5/249* (2021.05); *C08K 3/22* (2013.01); *C08K 7/18* (2013.01); *H05K 1/0373* (2013.01); *C08J 2379/08* (2013.01); *C08J 2463/00* (2013.01); *C08K 2003/2237* (2013.01); *C08K 2201/005* (2013.01); *C08L 2203/20* (2013.01); *H05K 2201/0209* (2013.01)

(58) Field of Classification Search
CPC .................................................. H05K 1/0313
See application file for complete search history.

(56) References Cited

U.S. PATENT DOCUMENTS

| | | | |
|---|---|---|---|
| 2004/0039127 A1 | 2/2004 | Amou et al. | |
| 2005/0003199 A1* | 1/2005 | Takaya | C08G 59/4223 |
| | | | 428/416 |
| 2019/0135651 A1 | 5/2019 | Sasaki et al. | |

FOREIGN PATENT DOCUMENTS

| | | |
|---|---|---|
| CN | 1478824 A | 3/2004 |
| CN | 1732224 A | 2/2006 |
| CN | 106461366 A | 2/2017 |
| CN | 09415222 A | 3/2019 |
| JP | 2000-91717 A | 3/2000 |
| JP | 2005-15652 A | 1/2005 |
| JP | 2005-15694 A | 1/2005 |
| JP | 2006-134869 A | 5/2005 |
| JP | 2014-502 A | 1/2014 |
| JP | 2018-44079 A | 3/2018 |
| JP | 2020-63459 A | 4/2020 |
| WO | WO 2015/019757 A1 | 2/2015 |
| WO | WO 2015/146816 A1 | 10/2015 |
| WO | WO 2017/217235 A1 | 12/2017 |
| WO | WO 2020/157828 A1 | 8/2020 |

OTHER PUBLICATIONS

ISR for PCT/JP2022/002836, dated Apr. 26, 2022 (w/ translation).
Written Opinion of ISA for PCT/JP2022/002836, dated Apr. 26, 2022 (w/ translation).

* cited by examiner

*Primary Examiner* — Ian A Rummel
(74) *Attorney, Agent, or Firm* — GREENBLUM & BERNSTEIN, P.L.C.

(57) ABSTRACT

An object is to provide a resin composition having a high permittivity and a low dissipation factor, and also a low coefficient of thermal expansion and a good appearance, and suitably used for producing an insulation layer of a printed wiring board, and a prepreg, a resin sheet, a laminate, a metal foil-clad laminate, and a printed wiring board obtainable by using the resin composition. The resin composition contains: (A) $BaTi_4O_9$; (B) a filler different from the $BaTi_4O_9$ (A); and (C) a thermosetting resin; wherein a median particle size of the $BaTi_4O_9$ (A) is 0.10 to 1.00 μm, and a volume ratio of the $BaTi_4O_9$ (A) to the filler (B), the $BaTi_4O_9$(A):the filler (B), ranges from 15:85 to 80:20.

13 Claims, No Drawings

RESIN COMPOSITION, PREPREG, RESIN SHEET, LAMINATE, METAL FOIL-CLAD LAMINATE, AND PRINTED WIRING BOARD

TECHNICAL FIELD

The present invention relates to a resin composition, a prepreg, a resin sheet, a laminate, a metal foil-clad laminate, and a printed wiring board.

BACKGROUND ART

In recent years, signal bands for information and telecommunication device such as PHS and mobile phones, and CPU clock time of computers have reached the GHz band, and thus the frequency has been higher. A dielectric loss of an electrical signal is proportionate to the product of a square root of a relative permittivity and a dissipation factor of an insulation layer forming a circuit, and a frequency of the electrical signal. For this reason, the higher a frequency of a signal used, the greater a dielectric loss becomes. An increase in the dielectric loss dampens an electrical signal to undermine the reliability of the signal. It is necessary for preventing this to select a material having low permittivity and dissipation factor for an insulation layer.

On the other hand, for an insulation layer of a high frequency circuit, there are demands for formation of a delay circuit, impedance matching of a wiring board in a low impedance circuit, a finer wiring pattern, and a circuit more complex with a substrate having a built-in capacitor, and there is a case where an insulation layer with a higher permittivity is required. For this reason, electronic components in which an insulation layer having a high permittivity and a low dissipation factor is used have been proposed (e.g., Patent Document 1). An insulation layer having a high permittivity and a low dissipation factor is formed by dispersing a filler such as a ceramic powder and an insulated metal powder in a resin.

CITATION LIST

Patent Document

Patent Document 1: Japanese Patent Laid-Open No. 2000-91717

SUMMARY OF INVENTION

Technical Problem

For increasing the relative permittivity of an insulation layer, a filler having a high relative permittivity is required to be blended; however a dissipation factor also simultaneously increases, thereby posing the problem of a higher transmission loss of a higher frequency signal.

The filler used for producing the insulation layer having a high permittivity and a low dissipation factor typically has a high specific gravity. For this reason, the filler is poorly dispersed and unevenly distributed in a resin composition, thereby posing the problem of aggravating an appearance of a molded article.

Further, an insulation layer with a high coefficient of thermal expansion causes warpage and interfacial delamination when producing a laminate. For this reason, it is important for the filler used for a printed wiring board and the like to have a low coefficient of thermal expansion in addition to a high permittivity and a low dissipation factor.

The present invention has been accomplished to solve the problem described above and has aimed to provide a resin composition having a high permittivity and a low dissipation factor, and also a low coefficient of thermal expansion and a good appearance, and suitably used for producing an insulation layer of a printed wiring board, and a prepreg, a resin sheet, a laminate, a metal foil-clad laminate, and a printed wiring board obtainable by using the resin composition.

Specifically, the present invention is as follows.

[1] A resin composition containing: (A) $BaTi_4O_9$; (B) a filler different from the $BaTi_4O_9$ (A); and (C) a thermosetting resin; wherein a median particle size of the $BaTi_4O_9$ (A) is 0.10 to 1.00 μm, and a volume ratio of the $BaTi_4O_9$ (A) to the filler (B), the $BaTi_4O_9$ (A):the filler (B), ranges from 15:85 to 80:20.

[2] The resin composition according to [1], wherein the filler (B) contains one or more selected from the group consisting of silica, alumina, calcium titanate, strontium titanate, aluminum nitride, boron nitride, boehmite, aluminum hydroxide, silicone rubber powder, and silicone composite powder.

[3] The resin composition according to [1] or [2], wherein a total content of the $BaTi_4O_9$ (A) and the filler (B) is 100 to 300 parts by mass based on 100 parts by mass of the resin solid content in the resin composition.

[4] The resin composition according to any of [1] to [3], wherein the thermosetting resin (C) contains one or more selected from the group consisting of cyanate ester compounds, maleimide compounds, epoxy compounds, phenolic compounds, alkenyl-substituted nadiimide compounds, oxetane resins, benzoxazine compounds, and compounds having a polymerizable unsaturated group.

[5] The resin composition according to [4], wherein the cyanate ester compound contains one or more selected from the group consisting of phenol novolac-type cyanate ester compounds, naphthol aralkyl-type cyanate ester compounds, naphthylene ether-type cyanate ester compounds, xylene resin-type cyanate ester compounds, bisphenol M-type cyanate ester compounds, bisphenol A-type cyanate ester compounds, diallyl bisphenol A-type cyanate ester compounds, bisphenol E-type cyanate ester compounds, bisphenol F-type cyanate ester compounds, and biphenyl aralkyl-type cyanate ester compounds, and prepolymers or polymers of these cyanate ester compounds.

[6] The resin composition according to [4] or [5], wherein the maleimide compound contains one or more selected from the group consisting of bis(4-maleimidephenyl)methane, 2,2-bis(4-(4-maleimidephenoxy)-phenyl)propane, bis(3-ethyl-5-methyl-4-maleimidephenyl)methane, maleimide compounds represented by the following formula (2), maleimide compounds represented by the following formula (3) and maleimide compounds represented by the following formula (4):

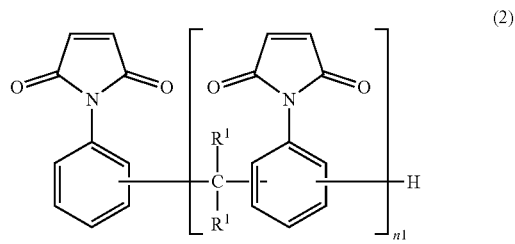

wherein R[1] each independently represents a hydrogen atom or a methyl group, and n1 is an integer of 1 to 10,

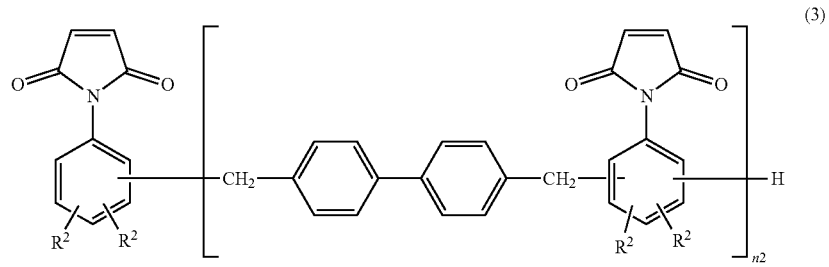

(3)

wherein R[2] each independently represents a hydrogen atom, an alkyl group having 1 to 5 carbon atoms, or a phenyl group, n2 is an average value and represents $1<n2\leq5$,

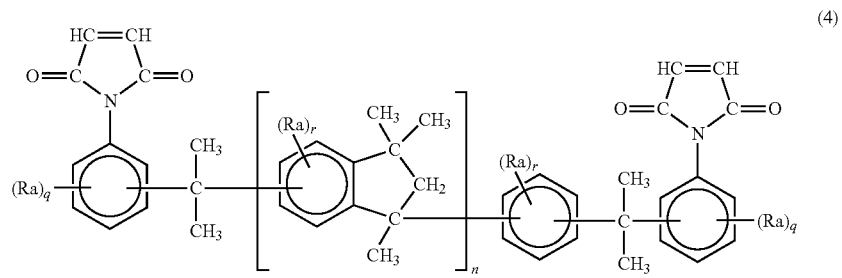

(4)

wherein Ra each independently represents a hydrogen atom, an alkyl group, an alkyloxy group, or an alkylthio group, each having 1 to 10 carbon atoms, an aryl group, an aryloxy group, or an arylthio group each having 6 to 10 carbon atoms, a cycloalkyl group having 3 to 10 carbon atoms, a halogen atom, a nitro group, a hydroxy group, or a mercapto group; q represents an integer of 0 to 4, and when q is an integer of 2 to 4, Ra is the same or different in the same ring; Rb each independently represents a hydrogen atom, an alkyl group, an alkyloxy group, or an alkylthio group, each having 1 to 10 carbon atoms, an aryl group, an aryloxy group, or an arylthio group, each having 6 to 10 carbon atoms, a cycloalkyl group having 3 to 10 carbon atoms, a halogen atom, a hydroxy group, or a mercapto group; r represents an integer of 0 to 3, and when r is 2 or 3, Rb is the same or different in the same ring; and n is an average number of repeat units and represents a value of 0.95 to 10.0.

[7] The resin composition according to any of [4] to [6], wherein the epoxy compound contains one or more selected from the group consisting of biphenyl aralkyl-type epoxy resins, naphthalene-type epoxy resins, naphthylene ether-type epoxy resins, and butadiene skeleton-containing epoxy resins.

[8] The resin composition according to any of [1] to [7], for use in a printed wiring board.

[9] A prepreg containing a base material, and the resin composition according to any of [1] to [8] penetrating or coating the base material.

[10] A resin sheet containing the resin composition according to any of [1] to [8].

[11] A laminate containing one or more selected from the group consisting of the prepreg according to [9], and the resin sheet according to [10].

[12] A metal foil-clad laminate containing the laminate according to [11] and a metal foil(s) disposed on one side or both sides of the laminate.

[13] A printed wiring board containing an insulation layer, and a conductor layer(s) disposed on one side or both sides of the insulation layer, wherein the insulation layer contains a cured product of the resin composition according to any of [1] to [8].

Advantageous Effects of Invention

The resin composition of the present invention can accordingly provide a resin composition having a high permittivity and a low dissipation factor, and also a low coefficient of thermal expansion and a good appearance, and suitably used for producing an insulation layer of a printed wiring board, and a prepreg, a resin sheet, a laminate, a metal foil-clad laminate, and a printed wiring board obtainable by using the resin composition.

DESCRIPTION OF EMBODIMENTS

Hereinafter, embodiments to carry out the present invention (hereinafter, referred to as the "present embodiment") will be described in more detail. The following present embodiments are examples to illustrate the present invention and do not intend to limit the present invention to the contents below. The present invention can be carried out with appropriate modifications within the scope of the spirit thereof.

In the present embodiments, the "resin solid content" or the "resin solid content in the resin composition" refers to the resin components of the resin composition, excluding $BaTi_4O_9$ (A), filler (B), additives and a solvent, and "100 parts by mass of the resin solid content" refers that the total amount of the resin components of the resin composition, excluding $BaTi_4O_9$ (A), filler (B), additives and a solvent, is regarded as 100 parts by mass, unless otherwise noticed.

[Resin Composition]

The resin composition of the present embodiment contains: (A) $BaTi_4O_9$; (B) a filler different from $BaTi_4O_9$ (A), and (C) a thermosetting resin, wherein a median particle size of $BaTi_4O_9$ (A) is 0.10 to 1.00 m, and a volume ratio of $BaTi_4O_9$ (A) to filler (B), the $BaTi_4O_9$ (A):the filler (B), ranges from 15:85 to 80:20.

<$BaTi_4O_9$ (A)>

The resin composition of the present embodiment contains $BaTi_4O_9$ (A). $BaTi_4O_9$ (A) can be used singly, or two or more kinds thereof having different median particle sizes (D50) can also be used in combination.

In the present embodiment, when the resin composition contains $BaTi_4O_9$ (A) having a specific median particle size, filler (B) to be described later, and thermosetting resin (C) to be described later in a specific volume ratio between $BaTi_4O_9$ (A) and filler (B), an insulation layer of a printed wiring board having a high permittivity and a low dissipation factor, and also a low coefficient of thermal expansion and a good appearance can be suitably obtained. The reason is not clear but the present inventors infer as follows.

Specifically, $BaTi_4O_9$ (A) having a median particle size (D50) of 0.10 to 1.00 µm can retain high dispersibility even when filler (B) is included in the resin composition such as a resin varnish. When such a $BaTi_4O_9$ (A) is used with filler (B) in a specific volume ratio, $BaTi_4O_9$ (A) and filler (B) tend less likely to cause uneven distribution and aggregation in thermosetting resin (C). For this reason, $BaTi_4O_9$ (A) and filler (B) are suitably dispersed and less likely cause uneven distribution and sedimentation due to aggregation in the resin composition such as a resin varnish. Further, since $BaTi_4O_9$ (A) and filler (B) are well-dispersed in the resin composition, the coefficient of thermal expansion of an insulation layer can be suitably controlled, thereby efficiently forming a dielectric channel at the insulation layer. From these reason, it is inferred that, according to the resin composition of the present embodiment, the insulation layer having a high permittivity and a low dissipation factor, additionally having a low coefficient of thermal expansion due to the efficient formation of a thermal path, and further having a good appearance can be obtained. However, the reason is not limited to this.

The median particle size (D50) of $BaTi_4O_9$ (A) is 0.10 to 1.00 µm, preferably 0.20 to 0.80 µm, and more preferably 0.25 to 0.50 µm. When a median particle size (D50) is within the above range, high dispersibility can be retained even when filler (B) is included in the resin composition such as a resin varnish, thereby tending to efficiently form a dielectric channel at the insulation layer. In the present description, the median particle size (D50) means the value at which a cumulative volume from smaller particles reaches 50% of the entire volume when a particle size distribution of a predetermined amount of a powder fed in a dispersion medium is measured using a laser diffraction scattering type particle size distribution analyzer. The median particle size (D50) can be calculated by measuring particle size distribution by a laser diffraction scattering method, but a specific measurement method can be referred to examples.

The relative permittivity of $BaTi_4O_9$ (A) is preferably 20 or more, and more preferably 25 or more. When a relative permittivity is 20 or more, the insulation layer having a high relative permittivity tends to be obtained. In the present embodiment, the relative permittivity of $BaTi_4O_9$ (A) is the value at 40 GHz by the open resonator method. In the present embodiment, the relative permittivity of $BaTi_4O_9$ (A) can be calculated using the Bruggeman formula (law of mixture).

The dissipation factor of $BaTi_4O_9$ (A) is preferably 0.01 or less, and more preferably 0.008 or less. When a dissipation factor is 0.01 or less, the insulation layer having a low dissipation factor tends to be obtained. In the present embodiment, the dissipation factor of $BaTi_4O_9$ (A) is the value at 40 GHz by the open resonator method. In the present embodiment, the dissipation factor of $BaTi_4O_9$ (A) can be calculated using the Bruggeman formula (law of mixture).

The resin composition of the present embodiment contains $BaTi_4O_9$ (A) and filler (B) to be described later in a volume ratio ($BaTi_4O_9$ (A):filler (B)) ranging from 15:85 to 80:20. When a volume ratio is within the above range, $BaTi_4O_9$ (A) and filler (B) are well dispersed in the resin composition such as a resin varnish and less likely cause uneven distribution and aggregation, whereby a molded article having a good appearance can be obtained. Further, since $BaTi_4O_9$ (A) and filler (B) are well-dispersed in the resin composition, the coefficient of thermal expansion of an insulation layer can be suitably controlled, thereby efficiently forming a dielectric channel at the insulation layer. For this reason, the insulation layer having a low coefficient of thermal expansion, a high permittivity and a low dissipation factor tends to be suitably obtained. For obtaining the insulation layer having a lower coefficient of thermal expansion, a higher permittivity and a lower dissipation factor, and thus obtaining a molded article having a better appearance, the volume ratio preferably ranges from 20:80 to 75:25, more preferably ranges from 25:75 to 70:30, further preferably ranges from 25:75 to 65:35, and furthermore preferably ranges from 30:70 to 60:40. When $BaTi_4O_9$ (A) and filler (B) to be described later are less than 20 and more than 80, respectively, in the volume ratio of $BaTi_4O_9$ (A) to filler (B) to be described later, a relative permittivity is low, the dispersibility deteriorates, and a poor appearance is likely caused. When $BaTi_4O_9$ (A) and filler (B) to be described later are more than 75 and less than 25, respectively, the dissipation factor and coefficient of thermal expansion are likely higher.

The total content of $BaTi_4O_9$ (A) and filler (B) to be described later is preferably 100 to 300 parts by mass, more preferably 120 to 280 parts by mass, and further preferably 150 to 270 parts by mass based on 100 parts by mass of the resin solid content in the resin composition. When the total content is within the above range, $BaTi_4O_9$ (A) and filler (B) are even more dispersed in thermosetting resin (C), the coefficient of thermal expansion of the insulation layer can be more suitably controlled, thereby tending to efficiently form a dielectric channel at the insulation layer.

The content of $BaTi_4O_9$ (A) in the resin composition is preferably 70 to 280 parts by mass, and more preferably 80 to 270 parts by mass based on 100 parts by mass of the resin solid content in the resin composition, in view of more excellent dispersibility with filler (B) to be described later, less likely causing uneven distribution and aggregation, being capable of more suitably controlling the low coefficient of thermal expansion of the insulation layer, and more efficiently forming a dielectric channel at the insulation layer.

(Production Method of $BaTi_4O_9$ (A) and a Slurry)

The production method of $BaTi_4O_9$ (A) according to the present embodiment is not particularly limited, and a known method can be used. Examples of such a method include a method in which titanium oxide ($TiO_2$) and barium carbonate ($BaCO_3$) are mixed in a molar ratio of predetermined amounts and then calcined in the atmosphere to obtain $BaTi_4O_9$. The calcined product can be pulverized using a known pulverizer to obtain $BaTi_4O_9$ (A) having a predetermined median particle size (D50). For the pulverizer, for example, a ball mill, a sand grinder, and a continuous bead mill can be used.

In the present embodiment, $BaTi_4O_9$ (A) can also be used as a slurry. The slurry of $BaTi_4O_9$ (A) according to the present embodiment is not particularly limited and can be obtained by a known method. For example, the above calcined product or a commercial $BaTi_4O_9$ (raw material) is added to a known organic solvent such as methyl ethyl ketone to prepare a $BaTi_4O_9$ solution (s), and then $BaTi_4O_9$ in solution (s) is pulverized using a pulverizer to homogeneously mix and disperse, thereby preparing the slurry of $BaTi_4O_9$ (A) having a predetermined median particle size (D50). The raw material, $BaTi_4O_9$, can be preliminary pulverized using a pulverizer as needed.

Examples of the raw material for $BaTi_4O_9$ (A) include BT-149 (tradename, median particle size (D50): 2.1 μm, Nippon Chemical Industrial Co., Ltd.)

The concentration of $BaTi_4O_9$ in $BaTi_4O_9$ solution (s) is not particularly limited, but is preferably 35 to 60 mass % based on 100 mass % of $BaTi_4O_9$ solution (s), in terms of the solid content, in view of excellent dispersibility and productivity.

$BaTi_4O_9$ solution (s) preferably contains a wetting and dispersing agent. For the wetting and dispersing agent, those to be described later can be referred to. The wetting and dispersing agent is preferably included in an amount of 0.1 to 5 parts by mass based on 100 parts by mass of $BaTi_4O_9$ solution (s).

The pulverization method is not particularly limited, and examples include a wet grinding using a bead mill. Examples of the pulverizer include a continuous bead mill. Of these, it is preferable to use a continuous bead mill because the median particle size (D50) is easily adjusted to a predetermined range to obtain uniform particlesd.

The bead used for a bead mill is not particularly limited, and examples include zirconia bead, zirconia•silica ceramic bead, alumina bead, and silica ceramic bead. Of these, zirconia bead and zirconia•silica ceramic bead are preferable in view of high pulverization efficiency, easy adjustment to a predetermined median particle size (D50), and being hard to break.

The particle size of the bead is not particularly limited, but is preferably 0.01 to 3 mm, more preferably 0.05 to 1 mm, and further preferably 0.05 to 0.5 mm. When a particle size of the bead is less than 0.01 mm, $BaTi_4O_9$ (A) having a predetermined median particle size (D50) tends to be difficult to obtain because such a bead is difficult to control the median particle size (D50) and easily breaks. When a particle size of the bead is more than 3 mm, $BaTi_4O_9$ (A) having a median particle size (D50) of 1.0 μm or less tends to be difficult to obtain because the pulverization rate reduces. The volume of the bead filled is preferably 40 to 70 vol %, and further preferably 50 to 65 vol %, based on the pulverizing chamber volume of the bead mill.

Alternatively, in the present embodiment, an organic solvent and $BaTi_4O_9$ are mixed using a disperser before pulverized, and the $BaTi_4O_9$ is dispersed in the organic solvent to obtain $BaTi_4O_9$ solution (s).

The concentration of $BaTi_4O_9$ (A) in the obtained slurry is preferably 30 to 60 mass %, based on 100 mass % of the slurry, in terms of the solid content, in view of excellent dispersibility and productivity.

<Filler (B)>

The resin composition of the present embodiment contains filler (B), which is different from $BaTi_4O_9$ (A). Filler (B) is not particularly limited as long as it is different from $BaTi_4O_9$ (A). Fillers for filler (B) can be used singly, or two or more thereof can also be used in combination.

The median particle size (D50) of filler (B) is preferably 0.10 to 10.00 μm, and more preferably 0.30 to 5.00 μm. When a median particle size (D50) is within the above range, filler (B) in the resin composition such as a resin varnish has more excellent dispersibility with $BaTi_4O_9$ (A) to even more less likely cause uneven distribution and aggregation, and thus tends to even more enhance an appearance of a molded article, a low dissipation factor and a low coefficient of thermal expansion. The median particle size (D50) of filler (B) is calculated in the same manner as for the median particle size (D50) of $BaTi_4O_9$ (A) described above.

Examples of filler (B) include inorganic fillers such as metal microparticles formed by insulating metals such as silica, silicon compounds (e.g., white carbon), metal oxides (e.g., alumina, titanium white, strontium titanate ($SrTiO_3$), $TiO_2$, $MgSiO_4$, $MgTiO_3$, $ZnTiO_3$, $ZnTiO_4$, $CaTiO_3$, $SrTiO_3$, $SrZrO_3$, $BaTi_2O_5$, $Ba_2Ti_9O_{20}$, $Ba(Ti, Sn)_9O_{20}$, $ZrTiO_4$, $(Zr, Sn)TiO_4$, $BaNd_2Ti_5O_{14}$, $BaSmTi O_{14}$, $Bi_2O_3$—$BaO$—$Nd_2O_3$—$TiO_2$, $La_2Ti_2O_7$, $BaTiO_3$, $Ba(Ti, Zr)O_3$, $(Ba, Sr)TiO_3$, zinc oxide, magnesium oxide, and zirconium oxide), metal nitrides (e.g., boron nitride, silicon nitride, and aluminum nitride), metal sulfates (e.g., barium sulfate), metal hydroxides (e.g., aluminum hydroxide, aluminum hydroxide heated products (e.g., those obtained by heat treating aluminum hydroxide and reducing a part of water of crystallization), boehmite, and magnesium hydroxide), zinc compounds (e.g., zinc borate and zinc stannate), clay, kaolin, talc, calcined clay, calcined kaolin, calcined talc, mica, E-glass, A-glass, NE-glass, C-glass, L-glass, D-glass, S-glass, M-glass G20, glass short fibers (including glass fine powders such as E glass, T glass, D glass, S glass, and Q glass), hollow glass, spherical glass, and gold, silver, palladium, copper, nickel, iron, cobalt, zinc, Mn—Mg—Zn, Ni—Zn, Mn—Zn, carbonyl iron, Fe—Si, Fe—Al—Si, and Fe—Ni; organic fillers such as rubber powders such as styrene base, butadiene base, and acryl base; core shell rubber powder; silicone resin powder; silicone rubber powder; and silicone composite powder.

Of these, filler (B) preferably contains one or more selected from the group consisting of silica, alumina, calcium titanate, strontium titanate, aluminum nitride, boron nitride, boehmite, aluminum hydroxide, silicone rubber powder, and silicone composite powder, in view of more excellent dispersibility with $BaTi_4O_9$ (A) to less likely cause uneven distribution and aggregation, and thus even more enhancing the low coefficient of thermal expansion, and more preferably contains silica.

Examples of the silica include natural silica, fused silica, synthetic silica, Aerosil, and hollow silica. These silicas can be used singly, or two or more thereof can also be used in combination. Of these, fused silica and hollow silica are preferable, in view of having a low coefficient of thermal expansion, and further excellent dispersibility in the resin composition to less likely cause uneven distribution and aggregation.

Silica can be a commercial product, and examples include SC2050-MB, SC5050-MOB, SC2500-SQ, SC4500-SQ, and SC5050-MOB (all product names, Admatechs Company Limited); and SFP-130MC (product name, Denka Company Limited).

In the present embodiment, $BaTi_4O_9$ other than $BaTi_4O_9$ (A), that is, $BaTi_4O_9$ having a different median particle size (D50) from $BaTi_4O_9$ (A), can be included in the resin composition as filler (B), but it is preferable that $BaTi_4O_9$ other than $BaTi_4O_9$ (A) be not included, in view of obtaining excellent dispersibility of $BaTi_4O_9$ (A) and filler (B) in the resin composition.

The content of filler (B) is preferably 10 to 220 parts by mass, more preferably 20 to 200 parts by mass, further preferably 30 to 150 parts by mass, and furthermore preferably 40 to 120 parts by mass based on 100 parts by mass of the resin solid content in the resin composition, in view of even more excellent dispersibility with $BaTi_4O_9$ (A) to even more less likely cause uneven distribution and aggregation, and even more enhancing the low thermal expansion in the resin composition.

In the present embodiment, a filler having a high permittivity can be used as filler (B) because such a filler can contribute to downsizing of a circuit, downsizing of high frequency electrical components due to an increased capacitance of a capacitor, and the like. Examples of such a filler include metal microparticles formed by insulating metals such as $TiO_2$, $MgSiO_4$, $MgTiO_3$, $ZnTiO_3$, $ZnTiO_4$, $CaTiO_3$, $SrTiO_3$, $SrZrO_3$, $BaTi_2O_5$, $Ba_2Ti_9O_{20}$, $Ba(Ti, Sn)_9O_{20}$, $ZrTiO_4$, $(Zr, Sn)TiO_4$, $BaNd_2Ti_5O_{14}$, $BaSmTiO_{14}$, $Bi_2O_3$—$BaO$—$Nd_2O_3$—$TiO_2$, $La_2Ti_2O_7$, $BaTiO_3$, $Ba(Ti, Zr)O_3$, and $(Ba, Sr)TiO_3$, and gold, silver, palladium, copper, nickel, iron, cobalt, zinc, Mn—Mg—Zn, Ni—Zn, Mn—Zn, carbonyl iron, Fe—Si, Fe—Al—Si, and Fe—Ni. These fillers for filler (B) can be used singly, or two or more thereof can also be used in combination.

<Thermosetting Resin (C)>

The resin composition of the present embodiment contains thermosetting resin (C). Thermosetting resin (C) is not particularly limited as long as it is a thermosetting resin or compound. Those for thermosetting resin (C) can be used singly, or two or more thereof can also be used in combination.

In view of well dispersing $BaTi_4O_9$ (A) and filler (B) and obtaining the resin composition having excellent thermal characteristics (low coefficient of thermal expansion and high glass transition temperature) and dielectric characteristic (low dissipation factor), thermosetting resin (C) preferably contains one or more selected from the group consisting of cyanate ester compounds, maleimide compounds, epoxy compounds, phenolic compounds, alkenyl-substituted nadiimide compounds, oxetane resins, benzoxazine compounds, and compounds having a polymerizable unsaturated group, more preferably contains one or more selected from the group consisting of maleimide compounds, cyanate ester compounds, phenolic compounds, and epoxy compounds, and further preferably contains one or more selected from the group consisting of maleimide compounds, cyanate ester compounds, and epoxy compounds.

The content of thermosetting resin (C) in the resin composition is preferably 30 to 95 parts by mass, more preferably 35 to 85 parts by mass, further preferably 35 to 80 parts by mass, and furthermore preferably 45 to 80 parts by mass based on 100 parts by mass of the total of $BaTi_4O_9$ (A) and filler (B), in view of well dispersing $BaTi_4O_9$ (A) and filler (B) and obtaining the resin composition having excellent thermal characteristics (low coefficient of thermal expansion and high glass transition temperature) and dielectric characteristic (low dissipation factor).

(Cyanate Ester Compound)

For the cyanate ester compound, a known compound can be appropriately used as long as the compound has two or more cyanate groups directly bonding an aromatic ring in a molecule (also referred to as "cyanate ester group", or "cyanate group"). The cyanate ester compounds can be used singly, or two or more thereof can also be used in combination.

Examples of such a cyanate ester compound include phenol novolac-type cyanate ester compounds, naphthol aralkyl-type cyanate ester compounds, naphthylene ether-type cyanate ester compounds, xylene resin-type cyanate ester compounds, bisphenol M-type cyanate ester compounds, bisphenol A-type cyanate ester compounds, diallyl bisphenol A-type cyanate ester compounds, bisphenol E-type cyanate ester compounds, bisphenol F-type cyanate ester compounds, biphenyl aralkyl-type cyanate ester compounds, bis(3,3-dimethyl-4-cyanatephenyl)methane, 1,3-dicyanatebenzene, 1,4-dicyanatebenzene, 1,3,5-tricyanatebenzene, 1,3-dicyanatenaphthalene, 1,4-dicyanatenaphthalene, 1,6-dicyanatenaphthalene, 1,8-dicyanatenaphthalene, 2,6-dicyanatenaphthalene, 2,7-dicyanatenaphthalene, 1,3,6-tricyanatenaphthalene, 4,4'-dicyanatebiphenyl, bis(4-cyanatephenyl)ether, bis(4-cyanatephenyl)thioether, and bis(4-cyanatephenyl)sulfone. These cyanate ester compounds can be made into prepolymers or polymers of cyanate ester compounds.

Of these, in view of well dispersing $BaTi_4O_9$ (A) and filler (B) and obtaining the resin composition having excellent thermal characteristics (low coefficient of thermal expansion and high glass transition temperature) and dielectric characteristic (low dissipation factor), and further obtaining the insulation layer having a suitable surface hardness, the cyanate ester compound preferably contains one or more selected from the group consisting of phenol novolac-type cyanate ester compounds, naphthol aralkyl-type cyanate ester compounds, naphthylene ether-type cyanate ester compounds, xylene resin-type cyanate ester compounds, bisphenol M-type cyanate ester compounds, bisphenol A-type cyanate ester compounds, diallyl bisphenol A-type cyanate ester compounds, bisphenol E-type cyanate ester compounds, bisphenol F-type cyanate ester compounds, and biphenyl aralkyl-type cyanate ester compounds, and prepolymers or polymers of these cyanate ester compounds, and more preferably naphthol aralkyl-type cyanate ester compounds.

For such a naphthol aralkyl-type cyanate ester compound, compounds represented by a formula (1) is more preferable.

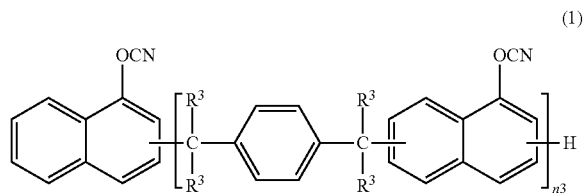

(1)

In the formula (1), $R^3$ each independently represents a hydrogen atom or a methyl group, and preferably a hydrogen atom. In the formula (1), n3 is an integer of 1 or more, and is preferably an integer of 1 to 20, and more preferably an integer of 1 to 10.

For the bisphenol A-type cyanate ester compound, one or more selected from the group consisting of 2,2-bis(4-cyanatephenyl)propane and prepolymers of 2,2-bis(4-cyanatephenyl)propane can be used.

Such a bisphenol A-type cyanate ester compound can be a commercial product, and examples include Primaset (registered trademark) BADCy (product name, Lonza K.K., 2,2-bis(4-cyanatephenyl)propane, cyanate ester group equivalent: 139 g/eq.), and CA210 (product name, Mitsubishi Gas Chemical Company, Inc., a prepolymer of 2,2-bis(4-cyanatephenyl)propane, cyanate ester group equivalent: 139 g/eq.).

These cyanate ester compounds can be produced in accordance with a known method. Examples of the specific production method include a method described in Japanese Patent Laid-Open No. 2017-195334 (particularly, paragraphs from 0052 to 0057).

The content of the cyanate ester compound is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition. The content of the cyanate ester compound can be 10 to 70 parts by mass, can be 15 to 65 parts by mass, and can be 20 to 60 parts by mass based on 100 parts by mass of the total of resin solid contents in the resin composition. When a content of the cyanate ester compound is within the above range, the heat resistance, low dissipation factor and the like tend to be more excellent.

(Maleimide Compound)

For the maleimide compound, a known compound can be appropriately used as long as the compound has one or more maleimide groups in a molecule, and the kind thereof is not particularly limited. The number of maleimide groups in a molecule of the maleimide compound is one or more, and preferably two or more. The maleimide compounds can be used singly, or two or more thereof can also be used in combination.

Examples of the maleimide compound include N-phenylmaleimide, N-hydroxyphenylmaleimide, bis(4-maleimidephenyl)methane, 2,2-bis(4-(4-maleimidephenoxy)-phenyl)propane, bis(3,5-dimethyl-4-maleimidephenyl)methane, bis(3-ethyl-5-methyl-4-maleimidephenyl)methane, bis(3,5-diethyl-4-maleimidephenyl)methane, maleimide compounds represented by a formula (2), maleimide compounds represented by a formula (3), and maleimide compounds represented by a formula (4), prepolymers of these maleimide compounds, and prepolymers of the above maleimide compound and an amine compound.

Of these, in view of allowing $BaTi_4O_9$ (A) and filler (B) to be well compatible and obtaining the resin composition having more excellent thermal characteristics (low coefficient of thermal expansion and high glass transition temperature) and dielectric characteristic (low dissipation factor), the maleimide compound preferably contains at least one or more selected from the group consisting of bis(4-maleimidephenyl)methane, 2,2-bis(4-(4-maleimidephenoxy)-phenyl)propane, bis(3-ethyl-5-methyl-4-maleimidephenyl)methane, maleimide compounds represented by the formula (2), maleimide compounds represented by the formula (3), and maleimide compounds represented by the formula (4), and more preferably contains one or more selected from the group consisting of 2,2-bis(4-(4-maleimidephenoxy)-phenyl)propane and maleimide compounds represented by the formula (3). Further, in view of obtaining the resin composition having even furthermore lower dissipation factor, the maleimide compound also preferably contains maleimide compounds represented by the formula (4).

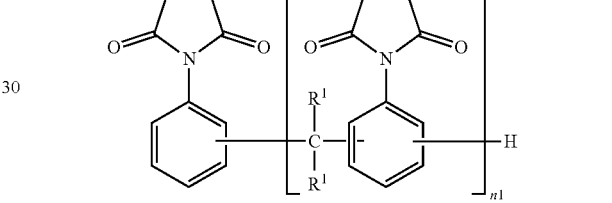

(2)

In the formula (2), $R^1$ each independently represents a hydrogen atom or a methyl group, and n1 is an integer of 1 to 10.

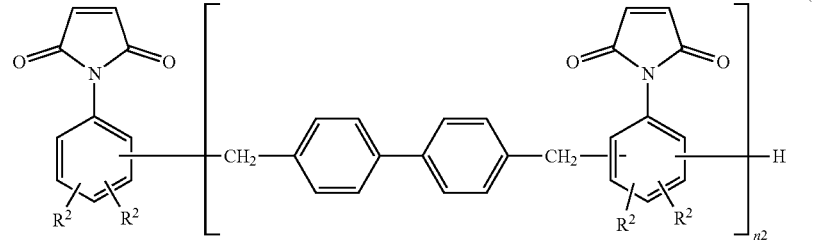

(3)

In the formula (3), $R^2$ each independently represents a hydrogen atom, an alkyl group having 1 to 5 carbon atoms, or a phenyl group, n2 is an average value and represents $1 < n2 \leq 5$.

Examples of the alkyl group having 1 to 5 carbon atoms include straight-chain alkyl groups such as a methyl group, an ethyl group, a propyl group, a butyl group, and a pentyl group; and branched-chain alkyl groups such as an isopropyl group, an isobutyl group, a sec-butyl group, and a tert-butyl group.

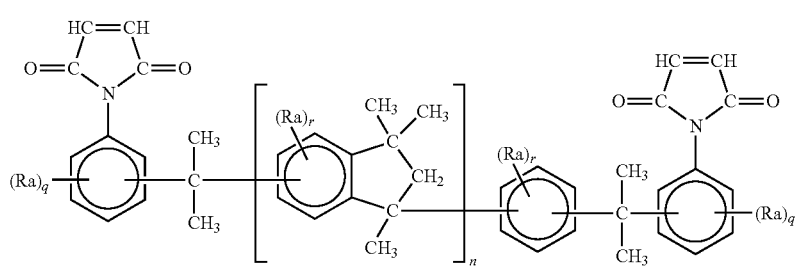

(4)

In the formula (4), Ra each independently represents a hydrogen atom, an alkyl group, an alkyloxy group, or an alkylthio group, each having 1 to 10 carbon atoms, an aryl group, an aryloxy group, or an arylthio group, each having 6 to 10 carbon atoms, a cycloalkyl group having 3 to 10 carbon atoms, a halogen atom, a nitro group, a hydroxy group, or a mercapto group. q represents an integer of 0 to 4. When q is an integer of 2 to 4, Ra is the same or different in the same ring. Rb each independently represents a hydrogen atom, an alkyl group, an alkyloxy group, or an alkylthio group, each having 1 to 10 carbon atoms, an aryl group, an aryloxy group, or an arylthio group, each having 6 to 10 carbon atoms, a cycloalkyl group having 3 to 10 carbon atoms, a halogen atom, a hydroxy group, or a mercapto group. r represents an integer of 0 to 3. When r is 2 or 3, Rb is the same or different in the same ring. n is an average number of repeat units and represents a value of 0.95 to 10.0.

Examples of the alkyl group having 1 to 10 carbon atoms include the alkyl groups having 1 to 5 carbon atoms given above, and also an n-pentyl group, an isopentyl group, a neopentyl group, an n-hexyl group, an isohexyl group, an n-heptyl group, an n-octyl group, a 2-ethylhexyl group, an n-nonyl group, an isononyl group, and an n-decyl group.

Examples of the alkyloxy group having 1 to 10 carbon atoms include a methoxy group, an ethoxy group, an n-propoxy group, an n-butoxy group, an n-pentyloxy group, and an n-hexyloxy group.

Examples of the alkylthio group having 1 to 10 carbon atoms include a methylthio group and an ethylthio group.

Examples of the aryl group having 6 to 10 carbon atoms include a phenyl group, a cyclohexylphenyl group, a phenol group, a cyanophenyl group, a nitrophenyl group, a naphthalene group, a biphenyl group, an anthracene group, a naphthacene group, an anthracyl group, a pyrenyl group, a perylene group, a pentacene group, a benzopyrene group, a chrysene group, a pyrene group, and a triphenylene group.

Examples of the aryloxy group having 6 to 10 carbon atoms include a phenoxy group and a p-tolyloxy group.

Examples of the arylthio group having 6 to 10 carbon atoms include a phenylthio group and a p-tolylthio group.

Examples of the cycloalkyl group having 3 to 10 carbon atoms include a cyclopropyl group, a cyclobutyl group, a cyclopentyl group, a cyclohexyl group, and a cycloheptyl group.

Examples of the halogen atom include a fluorine atom, a chlorine atom, a bromine atom, and an iodine atom.

In the formula (4), Ra each independently is preferably a hydrogen atom, an alkyl group having 1 to 6 carbon atoms, a cycloalkyl group having 3 to 6 carbon atoms, or an aryl group having 6 to 10 carbon atoms.

In the formula (4), q is preferably 2 or 3, and more preferably 2.

In the formula (4), all Rb are preferably a hydrogen atom. Alternatively, when r is an integer of 1 to 3, Rb each independently is preferably a hydrogen atom, an alkyl group having 1 to 6 carbon atoms, a cycloalkyl group having 3 to 6 carbon atoms, or an aryl group having 6 to 10 carbon atoms.

The maleimide compounds represented by the formula (4) can be produced in accordance with a known method. Examples of the specific production method include a method described in WO2020/217679.

The maleimide compound can be a commercial product, or a product produced by a known method can also be used. Examples of commercial products of the maleimide compound include BMI-70, BMI-80 (2,2-bis(4-(4-maleimidephenoxy)-phenyl)propane), and BMI-1000P (all product names, K.I Chemical Industry Co., Ltd.); BMI-3000, BMI-4000, BMI-5100, BMI-7000, and BMI-2300 (the maleimide compounds represented by the above formula (2) (all product names, DAIWA KASEI INDUSTRY CO., LTD.)); MIR-3000-MT (product name, the maleimide compound represented by the above formula (3), Nippon Kayaku Co., Ltd.); NE-X-9470S (product name, the maleimide compound represented by the above formula (4), DIC Corporation).

The content of the maleimide compound is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition. The content of the maleimide compound can also be 10 to 70 parts by mass, 15 to 65 parts by mass, and 20 to 60 parts by mass based on 100 parts by mass of the total of resin solid contents in the resin composition. When a content of the maleimide compound is within the above range, the heat resistance and the like tend to be more excellent.

(Epoxy Compound)

For the epoxy compound, a known compound can be appropriately used as long as the compound has one or more epoxy groups in a molecule, and the kind thereof is not particularly limited. The number of epoxy groups in a molecule of the epoxy compound is one or more, and preferably two or more. The epoxy compounds can be used singly, or two or more thereof can also be used in combination.

For the epoxy compound, conventionally known epoxy compounds and epoxy resins can be used. Examples include biphenyl aralkyl-type epoxy resins, naphthalene-type epoxy resins, bisnaphthalene-type epoxy resins, polyfunctional phenol-type epoxy resins, naphthylene ether-type epoxy resins, phenol aralkyl-type epoxy resins, phenol novolac-type epoxy resins, cresol novolac-type epoxy resins, xylene novolac-type epoxy resins, naphthalene skeleton-modified novolac-type epoxy resins, dicyclopentadiene novolac-type epoxy resins, biphenyl novolac-type epoxy resins, phenol aralkyl novolac-type epoxy resins, naphthol aralkyl novolac-type epoxy resins, aralkyl novolac-type epoxy resins, aromatic hydrocarbon formaldehyde-type epoxy compounds, anthraquinone-type epoxy compounds, anthracene-type epoxy resins, naphthol aralkyl-type epoxy compounds, dicyclopentadiene-type epoxy resins, ZYLOCK-type epoxy compounds, bisphenol A-type epoxy resins, bisphenol E-type epoxy resins, bisphenol F-type epoxy resins, bisphenol S-type epoxy resins, bisphenol A novolac-type epoxy resins, phenol-type epoxy compounds, biphenyl-type epoxy resins, aralkyl novolac-type epoxy resins, triazine skeleton epoxy compounds, triglycidyl isocyanurate, alicyclic epoxy resins, polyol-type epoxy resins, glycidylamine, glycidyl-type ester resins, compounds obtained by epoxidating a double bond of a double bond-containing compound such as butadiene such as butadiene skeleton-containing epoxy resins, and compounds obtained by reaction of hydroxy group-containing silicone resins and epichlorohydrin.

Of these, in view of well dispersing $BaTi_4O_9$ (A) and filler (B) and obtaining the resin composition having excellent thermal characteristics (low coefficient of thermal expansion and high glass transition temperature) and dielectric characteristic (low dissipation factor), the epoxy compound preferably contains one or more selected from the group consisting of biphenyl aralkyl-type epoxy resins, naphthalene-type epoxy resins, naphthylene ether-type epoxy resins, and butadiene skeleton-containing epoxy resins, and more preferably contains one or more selected from the group consisting of naphthylene ether-type epoxy resins and biphenyl aralkyl-type epoxy resins.

The biphenyl aralkyl-type epoxy resin is preferably compounds represented by the following formula (5).

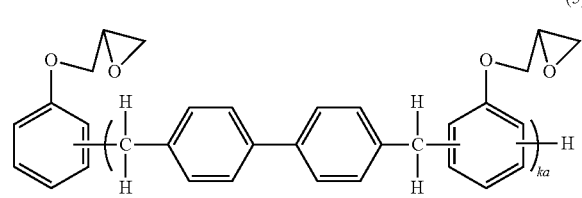

(5)

In the formula (5), ka represents an integer of 1 or more, preferably an integer of 1 to 20, and more preferably an integer of 1 to 10.

The biphenyl aralkyl-type epoxy resin can be a commercial product, or a product produced by a known method can also be used. Examples of the commercial product include NC-3000, NC-3000L, NC-3000H, and NC-3000FH (the compounds represented by the above formula (5), and in the formula (5), ka is an integer of 1 to 10) (all product names, Nippon Kayaku Co., Ltd.).

The naphthalene-type epoxy resin is preferably compounds represented by the following formula (6).

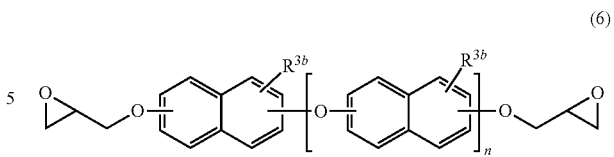

(6)

In the formula (6), $R^{3b}$ each independently represents a hydrogen atom, an alkyl group having 1 to 5 carbon atoms (e.g., a methyl group or an ethyl group), an aralkyl group, a benzyl group, a naphthyl group, a naphthyl group containing at least one glycidyloxy group, or a naphthylmethyl group containing at least one glycidyloxy group, and n represents an integer of 0 or more (e.g., 0 to 2).

Examples of the commercial product of the compound represented by the above formula (6) include EPICLON (registered trademark) EXA-4032-70M (in the above formula (6), n=0, and all $R^{3b}$ are a hydrogen atom), and EPICLON (registered trademark) HP-4710 (in the above formula (6), n=0, and $R^{3b}$ is a naphthylmethyl group containing at least 1 glycidyloxy group) (all product names, DIC Corporation).

The naphthylene ether-type epoxy resin is preferably bifunctional epoxy compounds represented by the following formula (7) or polyfunctional epoxy compounds represented by the following formula (8), or a mixture of these.

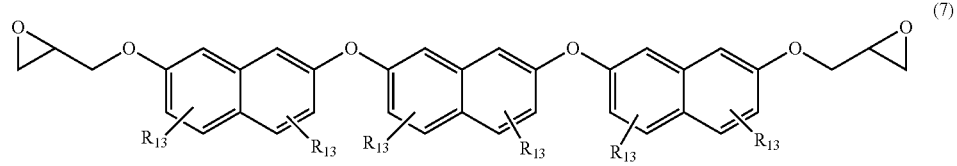

(7)

In the formula (7), $R_{13}$ each independently represents a hydrogen atom, an alkyl group having 1 to 3 carbon atoms (e.g., a methyl group or an ethyl group), or an alkenyl group having 2 to 3 carbon atoms (e.g., a vinyl group, allyl group, or a propenyl group).

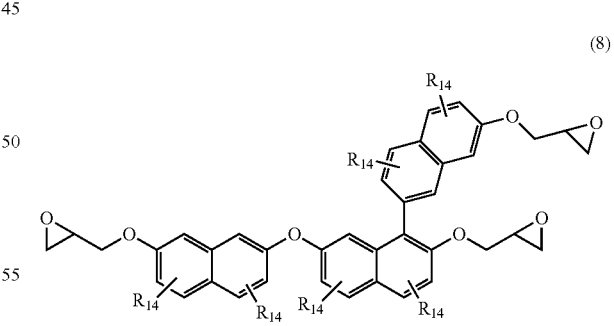

(8)

In the formula (8), $R_{14}$ each independently represents a hydrogen atom, an alkyl group having 1 to 3 carbon atoms (e.g., a methyl group or an ethyl group), or an alkenyl group having 2 to 3 carbon atoms (e.g., a vinyl group, an allyl group, or a propenyl group).

The naphthyl ether-type epoxy resin can be a commercial product, or a product produced by a known method can also be used. Examples of the commercial product include HP-6000, EXA-7300, EXA-7310, EXA-7311, EXA-7311L, EXA7311-G3, EXA7311-G4, EXA-7311G4S, and EXA-7311G5 (all product names, DIC Corporation). Of these, HP-6000 (product name) is preferable.

The butadiene skeleton-containing epoxy resin can be any epoxy resin as long as it has the butadiene skeleton and an epoxy group in a molecule. Examples of such a resin include butadiene skeleton-containing epoxy resins represented by the following formulae (9) to (11).

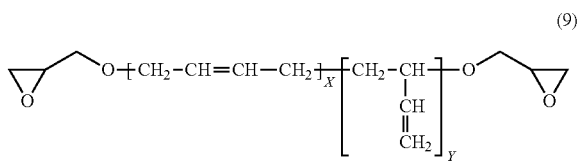

(9)

In the formula (9), X represents an integer of 1 to 100, and Y represents an integer of 0 to 100.

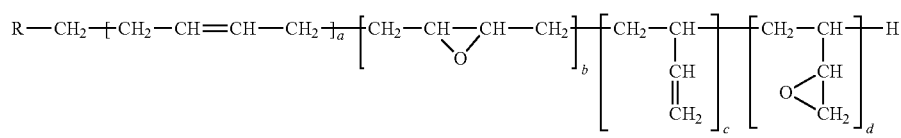

(10)

In the formula (10), R represents a hydrogen atom or an alkyl group having 1 to 10 carbon atoms, a and b each independently represents an integer of 1 to 100, c and d each independently represents an integer of 0 to 100. Examples of the alkyl group include a methyl group, an ethyl group, a propyl group, and a butyl group.

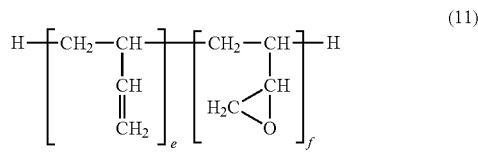

(11)

In the formula (11), e represents an integer of 24 to 35, and f represents an integer of 8 to 11.

The butadiene skeleton-containing epoxy resin can be a commercial product, or a product produced by a known method can also be used. Examples of the commercial product include R-15EPT and R-45EPT (the compound of the above formula (9), wherein X=50 and Y=0) (all product names, Nagase ChemteX Corporation); EPOLEAD (registered trademark) PB3600 and PB4700 (all product names, Daicel Corporation); Nisseki polybutadiene E-1000-3.5 (product name, Nippon Petrochemicals Co., Ltd.).

The content of the epoxy compound is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition. The content of the epoxy compound can also be 10 to 70 parts by mass, 15 to 65 parts by mass, and 20 to 60 parts by mass based on 100 parts by mass of the total of resin solid contents in the resin composition. When a content of the epoxy compound is within the above range, the adhesivity, flexibility and the like tend to be more excellent.

(Phenolic Compound)

For the phenolic compound, a known compound can be appropriately used as long as the compound has two or more phenolic hydroxy groups in one molecule, and the kind thereof is not particularly limited. The phenolic compounds can be used singly, or two or more thereof can also be used in combination.

Examples of the phenolic compound include cresol novolac-type phenolic resins, biphenyl aralkyl-type phenolic resins represented by the formula (12), naphthol aralkyl-type phenolic resins represented by the formula (13), aminotriazine novolac-type phenolic resins, naphthalene-type phenolic resins, phenol novolac resins, alkylphenol novolac resins, bisphenol A-type novolac resins, dicyclopentadiene-type phenolic resins, ZYLOCK-type phenolic resins, terpene-modified phenolic resins, and polyvinylphenols.

Of these, in view of obtaining excellent formability and surface hardness, cresol novolac-type phenolic resins, biphenyl aralkyl-type phenolic resins represented by the formula (12), naphthol aralkyl-type phenolic resins represented by the formula (13), aminotriazine novolac-type phenolic resins, and naphthalene-type phenolic resins are preferable, and biphenyl aralkyl-type phenolic resins represented by the formula (12) and naphthol aralkyl-type phenolic resins represented by the formula (13) are more preferable.

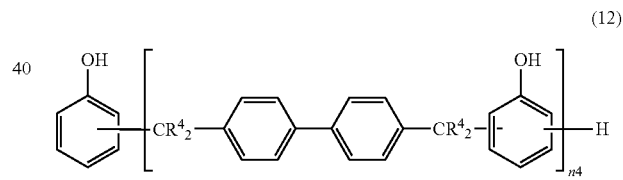

(12)

In the formula (12), $R^4$ each independently represents a hydrogen atom or a methyl group, and n4 is an integer of 1 to 10.

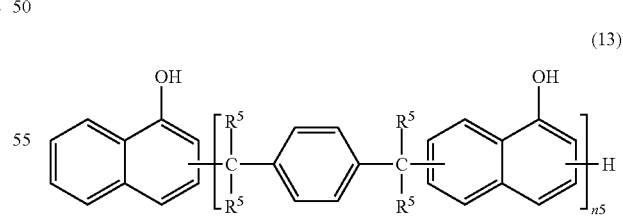

(13)

In the formula (13), $R^5$ each independently represents a hydrogen atom or a methyl group, and n5 is an integer of 1 to 10.

The content of the phenolic compound is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition.

When a content of the phenolic compound is within the above range, the adhesivity, flexibility and the like tend to be more excellent.

(Alkenyl-Substituted Nadiimide Compound)

The alkenyl-substituted nadiimide compound is not particularly limited as long as the compound has one or more alkenyl-substituted nadiimide groups in a molecule. The alkenyl-substituted nadiimide compounds can be used singly, or two or more thereof can also be used in combination.

Examples of the alkenyl-substituted nadiimide compound include compounds represented by the following formula (14).

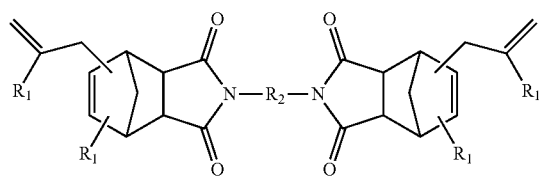

(14)

In the formula (14), $R_1$ each independently represents a hydrogen atom, or an alkyl group having 1 to 6 carbon atoms (e.g., a methyl group or an ethyl group), $R^2$ is an alkylene group having 1 to 6 carbon atoms, a phenylene group, a biphenylene group, a naphthylene group, or groups represented by a formula (15) or a formula (16).

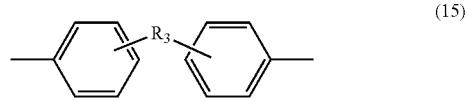

(15)

In the formula (15), $R_3$ represents a methylene group, an isopropylidene group, CO, O, S or $SO_2$.

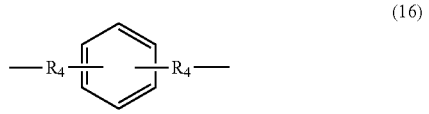

(16)

In the formula (16), $R_4$ each independently represents an alkylene group having 1 to 4 carbon atoms, or a cycloalkylene group having 5 to 8 carbon atoms.

The alkenyl-substituted nadiimide compound represented by the formula (14) can be a commercial product, or a product produced in accordance with a known method can also be used. Examples of the commercial product include BANI-M, and BANI-X (all product names, Maruzen Petrochemical Co., Ltd.).

The content of the alkenyl-substituted nadiimide compound is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition. When a content of the alkenyl-substituted nadiimide compound is within the above range, the adhesivity, flexibility and the like tend to be more excellent.

(Oxetane Resin)

Oxetane resin is not particularly limited, and a generally known resin can be used. The oxetane resins can be used singly, or two or more thereof can also be used in combination.

Examples of the oxetane resin include alkyloxetane such as oxetane, 2-methyloxetane, 2,2-dimethyloxetane, 3-methyloxetane, and 3,3-dimethyloxetane, 3-methyl-3-methoxymethyloxetane, 3,3-di(trifluoromethyl)perfluorooxetane, 2-chloromethyloxetane, 3,3-bis(chloromethyl) oxetane, biphenyl-type oxetane, OXT-101 (product name, Toagosei Co., Ltd.), and OXT-121 (product name, Toagosei Co., Ltd.).

The content of the oxetane resin is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition. When a content of the oxetane resin is within the above range, the adhesivity, flexibility and the like tend to be more excellent.

(Benzoxazine Compound)

The benzoxazine compound is not particularly limited as long as the compound has two or more dihydrobenzoxazine rings in a molecule, and a generally known compound can be used. The benzoxazine compounds can be used singly, or two or more thereof can also be used in combination.

Examples of the benzoxazine compound include bisphenol A-type benzoxazine BA-BXZ), bisphenol F-type benzoxazine BF-BXZ, and bisphenol S-type benzoxazine BS-BXZ (all product names, Konishi Chemical Ind. Co., Ltd.).

The content of the benzoxazine compound is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition. When a content of the benzoxazine compound is within the above range, the adhesivity, flexibility and the like tend to be more excellent.

(Compound Having a Polymerizable Unsaturated Group)

The compound having a polymerizable unsaturated group is not particularly limited, and a generally known compound can be used. The compounds having a polymerizable unsaturated group can be used singly, or two or more thereof can also be used in combination.

Examples of the compound having a polymerizable unsaturated group include vinyl compounds such as ethylene, propylene, styrene, divinyl benzene, and divinyl biphenyl; meth(acrylates) of monohydric or polyhydric alcohol such as methyl (meth)acrylate, 2-hydroxyethyl (meth)acrylate, 2-hydroxypropyl (meth)acrylate, polypropylene glycol di(meth)acrylate, trimethylolpropane di(meth)acrylate, trimethylolpropane tri(meth)acrylate, pentaerythritol tetra(meth) acrylate, and dipentaerythritol hexa(meth)acrylate; epoxy (meth)acrylates such as bisphenol A-type epoxy (meth) acrylate, and bisphenol F-type epoxy (meth)acrylate; and benzocyclobutene resins.

The content of the compound having a polymerizable unsaturated group is preferably 1 to 99 parts by mass, more preferably 3 to 90 parts by mass, further preferably 4 to 85 parts by mass, and furthermore preferably 5 to 80 parts by mass based on 100 parts by mass of the total of resin solid contents in the resin composition. When a content of the compound having a polymerizable unsaturated group is within the above range, the adhesivity, flexibility and the like tend to be more excellent.

<Silane Coupling Agent>

The resin composition of the present embodiment can further contain a silane coupling agent. When the resin composition contains a silane coupling agent, the dispersibility of $BaTi_4O_9$ (A) and filler (B) in the resin composition further enhances, thereby tending to further increase the adhesive strength of each component included in the resin composition and the base material to be described later. The silane coupling agents can be used singly, or two or more thereof can also be used in combination.

The silane coupling agent is not particularly limited, and a silane coupling agent generally used for the surface treatment of an inorganic matter can be used. Examples include aminosilane compounds (e.g., γ-aminopropyltriethoxysilane, and N-β-(aminoethyl)-γ-aminopropyltrimethoxysilane), epoxysilane compounds (e.g., γ-glycidoxy propyltrimethoxysilane), acrylsilane compounds (e.g., γ-acryloxypropyl trimethoxysilane), cationic silane compounds (e.g., N-β-(N-vinylbenzylaminoethyl)-γ-aminopropyltrimethoxysilane hydrochloride), styrylsilane compounds, phenylsilane compounds. The silane coupling agents can be used singly, or two or more thereof can also be used in combination. Of these, the silane coupling agent is preferably an epoxysilane compound. Examples of the epoxysilane compound include KBM-403, KBM-303, KBM-402, and KBE-403 (all product names, Shin-Etsu Chemical Co., Ltd.).

The content of the silane coupling agent is not particularly limited and can be 0.1 to 5.0 parts by mass based on 100 parts by mass of the resin solid content in the resin composition.

<Wetting and Dispersing Agent>

The resin composition of the present embodiment can further contain a wetting and dispersing agent. When the resin composition contains a wetting and dispersing agent, the dispersibility of the filler tends to be more enhanced. The wetting and dispersing agents can be used singly, or two or more thereof can also be used in combination.

The wetting and dispersing agent can be any known dispersing agent (dispersion stabilizer) used for dispersing the filler, and examples include DISPER BYK (registered trademark)-110, 111, 118, 180, 161, 2009, 2152, 2155, W996, W9010, and W903 (all product names, BYK Japan KK).

The content of the wetting and dispersing agent is not particularly limited and is preferably 0.5 parts by mass or more and 5.0 parts by mass or less based on 100 parts by mass of the resin solid content in the resin composition.

<Curing Accelerator>

The resin composition of the present embodiment can further contain a curing accelerator. The curing accelerators can be used singly, or two or more thereof can also be used in combination.

Examples of the curing accelerator include imidazoles such as triphenylimidazole; organic peroxides such as benzoyl peroxide, lauroyl peroxide, acetyl peroxide, para-chlorobenzoyl peroxide, di-tert-butyl-di-perphthalate; azo compounds such as azobisnitrile; tertiary amines such as N,N-dimethylbenzylamine, N,N-dimethylaniline, N,N-dimethyltoluidine, 2-N-ethylanilino ethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; organic metal salts such as lead naphthenate, lead stearate, zinc naphthenate, zinc octylate, manganese octylate, stannous oleate, dibutyltin maleate, manganese naphthenate, cobalt naphthenate, and acetylacetone iron; those obtained by dissolving an organic metal salt in a hydroxy group-containing compound such as phenol, and bisphenol; inorganic metal salts such as stannous chloride, zinc chloride, and aluminum chloride; and organic tin compounds such as dioctyl tin oxide, other alkyl tins, and alkyl tin oxide. Of these, triphenyl imidazole is preferable because it accelerates the curing reaction, and the glass transition temperature tends to be more enhanced.

<Solvent>

The resin composition of the present embodiment can further contain a solvent. When the resin composition contains a solvent, the viscosity of the resin composition when preparing reduces, the handleability (operability) further enhances, and the penetrating ability into a base material tends to further enhance. The solvents can be used singly, or two or more thereof can also be used in combination.

The solvent is not particularly limited as long as it can dissolve a part or all of each of the components in the resin composition. Examples include ketones (acetone, and methyl ethyl ketones), aromatic hydrocarbons (e.g., toluene, and xylene), amides (e.g., dimethyl formaldehyde), propylene glycol monomethyl ether, and acetate thereof.

<Other Components>

The resin composition of the present embodiment can contain components other than above as long as expected characteristics are not affected. Examples of flame retardant compound include bromine compounds such as 4,4'-dibromobiphenyl; nitrogen-containing compounds such as ester phosphate, melamine phosphate, melamine, and benzoguanamine; and silicon compounds. Further, examples of various additives include an ultraviolet absorbent, an antioxidant, a photopolymerization initiator, a fluorescent whitening agent, a photosensitizing agent, a dye, a pigment, a thickener, a lubricant, a defoaming agent, a dispersing agent, a leveling agent, a brightening agent, and a polymerization inhibitor.

[Production Method of the Resin Composition]

Examples of the production method of the resin composition of the present embodiment include a method in which $BaTi_4O_9$ (A), filler (B), thermosetting resin (C), and, as needed, the components described above are mixed and thoroughly stirred. During this operation, known treatments such as stirring, mixing and kneading can be carried out to homogeneously dissolve or disperse each of the components. Specifically, when the stirring and dispersing treatments are carried out using a stirring tank equipped with a stirrer having a reasonable stirring ability, the dispersibility of $BaTi_4O_9$ (A) and filler (B) in the resin composition can be enhanced. The above stirring, mixing, and kneading treatments can be appropriately carried out, for example, by using known devices such as a device for the purpose of mixing such as a ball mill, and a bead mill, or a rotation- or revolution-type mixing device.

During the preparation of the resin composition, a solvent is used as needed, so that the resin composition can be prepared in the form of a resin varnish. The kind of the solvent is not particularly limited as long as it can dissolve the resin in the resin composition. Specific examples thereof are as described above.

[Usage]

The resin composition of the present embodiment, for example, can be suitably used as a material for a cured product, a prepreg, a film-like underfill material, a resin sheet, a laminate, a build-up material, a non-conductive film, a metal foil-clad laminate, a printed wiring board, and a fiber-reinforced composite material, or for producing a semiconductor device. Hereinafter, these will be described.

[Cured Product]

The cured product is obtained by curing the resin composition of the present embodiment. In the production method of the cured product, for example, the resin composition of the present embodiment is fused or dissolved in a solvent, then poured into a mold and cured under typical conditions using heat, light or the like to obtain the cured product. In the case of thermosetting, the curing temperature is preferably in a range from 120 to 300° C., in view of efficiently proceeding the curing and preventing the deterioration of a cured product to be obtained.

[Prepreg]

The prepreg of the present embodiment contains a base material and the resin composition of the present embodiment penetrating or coating the base material. The prepreg of the present embodiment can be obtained by, for example, allowing the resin composition of the present embodiment (e.g., uncured state (stage A)) to penetrate or coat a base material, then drying at 120 to 220° C. for about 2 to 15 minutes to semi-cure. In this case, the amount of the resin composition (including the cured product of the resin composition) adhered to the base material, that is, the amount of the resin composition relative to the total amount of the semi-cured prepreg (including $BaTi_4O_9$ (A), and filler (B)), is preferably in a range from 20 to 99 mass %.

The base material is not particularly limited as long as it is a base material used for various printed wiring board materials. Examples of the kind of material of the base material include glass fibers (e.g., E-glass, D-glass, L-glass, S-glass, T-glass, Q-glass, UN-glass, NE-glass, and spherical glass), inorganic fibers other than the glass fibers (e.g., quartz), organic fibers (e.g., polyimide, polyamide, polyester, liquid crystalline polyester, and polytetrafluoroethylene). The form of the base material is not particularly limited, and examples include woven fabrics, unwoven fabrics, rovings, chopped strand mats, and surfacing mats. These base materials can be used singly, or two or more thereof can also be used in combination. Of these base materials, in view of the dimensional stability, woven fabrics subjected to super fiber opening treatment, and filling treatment are preferable. In view of moisture absorption and heat resistance, glass woven fabrics surface treated with a silane coupling agent such as epoxysilane treatment and aminosilane treatment are preferable. In view of having excellent dielectric characteristic, glass fibers such as E-glass, L-glass, NE-glass, and Q-glass are preferable.

[Resin Sheet]

The resin sheet of the present embodiment contains the resin composition of the present embodiment. The resin sheet can also be a resin sheet with a support, which contains a support and a layer formed of the resin composition of the present embodiment disposed on the surface of the support. The resin sheet can be used as a build-up film or dry film solder resist. The production method of the resin sheet is not particularly limited, and examples include a method in which a solution of the resin composition of the present embodiment dissolved in a solvent is applied to (coating) the support and dried to obtain the resin sheet.

Examples of the support include polyethylene films, polypropylene films, polycarbonate films, polyethylene terephthalate films, ethylene tetrafluoroethylene copolymer films, and mold releasing films in which a mold release agent is coated on the surface of these films, organic film base material such as polyimide films, conductive foils such as copper foil, and aluminum foil, and plate-like supports such as glass plates, SUS plates, and FRP, but are not limited thereto.

Examples of the coating method (applying method) include a method in which a solution of the resin composition of the present embodiment dissolved in a solvent is applied to the support using a bar coater, a die coater, a doctor blade, or a baker applicator. After drying, the support can be released or etched from the resin sheet with the support, in which the support and the resin composition are laminated, to obtain a single layer sheet (resin sheet). The solution of the resin composition of the present embodiment dissolved in a solvent is fed into a mold having a sheet-like cavity and dried, for example, to form a sheet-like shape, thereby to obtain a single layer sheet (resin sheet) without using a support.

In the manufacture of the single layer sheet or the resin sheet with the support according to the present embodiment, the drying conditions for removing the solvent are not particularly limited, but the drying is preferably carried out for 1 to 90 minutes at a temperature of 20 to 200° C., in view of easily removing the solvent in the resin composition and inhibiting the progress of curing while drying. In the single layer sheet or the resin sheet with the support, the resin composition can be used in a uncured state after simply drying the solvent, or can be used in a semi-cured state (stage B) as needed. The thickness of the resin layer of the single layer sheet or the resin sheet with the support according to the present embodiment can be adjusted by the concentration and the coating thickness of the solution of the resin composition of the present embodiment, and is preferably, but not particularly limited to, 0.1 to 500 μm in view of easily removing the solvent when drying.

[Laminate]

The laminate of the present embodiment contains one or more selected from the group consisting of the prepreg and the resin sheet of the present embodiment. In the case of two or more of the prepregs and the resin sheets are laminated, the resin composition used for each prepreg and resin sheet can be the same or different. In the case of using both prepreg and resin sheet, the resin composition used for these can be the same or different. In the laminate of the present embodiment, the one or more selected from the group consisting of the prepreg and the resin sheet can be in a semi-cured state (stage B) or a completely cured state (stage C). The semi-cured state (stage B) refers that each of the components included in the resin composition has not proactively started reacting (curing) while the resin composition is in a dried state, in other words, the resin composition has been heated to the extent that it is no longer viscous in order to volatilize the solvent, and the semi-cured stateencompasses a state in which the resin composition is not cured while the solvent has been simply volatilized even without heating. In the present embodiment, the minimum melt viscosity of the semi-cured state (stage B) is typically 20,000 Pa·s or less. The minimum melt viscosity is, for example, 10 Pa·s or more in terms of the lower limit. In the present embodiment, the minimum melt viscosity is measured by the following method. Specifically, 1 g of a resin powder collected from the resin composition is used as a sample, and a minimum melt viscosity is measured by a rheometer (ARES-G2 (product name), TA Instruments). The minimum melt viscosity of the resin powder herein is measured using a disposable plate having a plate diameter of 25 mm in a range from 40° C. or more and 180° C. or less, under the conditions of a heating rate of 2° C./min, a frequency of 10.0 rad/sec, and a strain of 0.1%.

[Metal Foil-Clad Laminate]

The metal foil-clad laminate of the present embodiment contains the laminate of the present embodiment and a metal foil disposed on one side or each of both sides of the laminate.

The metal foil-clad laminate can contain at least 1 sheet of the prepreg of the present embodiment and a metal foil laminated on one side or each of both sides of the prepreg.

The metal foil-clad laminate can contain at least 1 resin sheet of the present embodiment and a metal foil laminated on one side or each of both sides of the resin sheet.

In the metal foil-clad laminate of the present embodiment, the resin composition used for each prepreg and resin sheet can be the same or different. In the case of using both prepreg and resin sheet, the resin composition used for these can be the same or different. In the metal foil-clad laminate of the present embodiment, the one or more selected from the group consisting of the prepreg and the resin sheet can be in a semi-cured state or a completely cured state.

In the metal foil-clad laminate of the present embodiment, a metal foil is laminated on one or more selected from the group consisting of the prepreg of the present embodiment and the resin sheet of the present embodiment; however, it is preferable that a metal foil be laminated in such a way as to contact the surface of the one or more selected from the group consisting of the prepreg of the present embodiment and the resin sheet of the present embodiment. "The metal foil be laminated in such a way as to contact the surface of the one or more selected from the group consisting of the prepreg and the resin sheet" means that a layer such as an adhesive layer is not included between the prepreg or resin sheet and the metal foil, but that the prepreg or resin sheet directly contacts the metal foil. Due to this, the peel strength of the metal foil of the metal foil-clad laminate increases, and the insulation reliability of a printed wiring board tends to be enhanced.

The metal foil-clad laminate of the present embodiment can have one or more laminated prepregs and/or resin sheets of the present embodiment and the metal foil(s) disposed on one side or both sides of the prepregs and/or resin sheets. Examples of the production method of the metal foil-clad laminate of the present embodiment include a method in which one or more laminated prepregs and/or resin sheets of the present embodiment, and the metal foil(s) disposed on one side or both sides thereof are laminated. Examples of the formation method include a method typically used when forming a laminate and a multilayer board for a printed wiring board, and more specific examples include a method of laminating using a multistage press machine, a multistage vacuum press machine, a continuous molding machine, or an autoclave molding machine, at a temperature of about 180 to 350° C., for heating time of about 100 to 300 minutes, and a surface pressure of about 20 to 100 kgf/cm$^2$.

Further, the prepreg and/or the resin sheet of the present embodiment is laminated in combination with a separately manufactured wiring board for an inner layer to form a multilayer board. In the production method of the multilayer board, for example, copper foils having a thickness of about 35 μm are disposed on both sides of one or more laminated prepregs and/or resin sheets of the present embodiment, and laminated by the above formation method to prepare a copper foil-clad laminate. Then, an inner layer circuit is formed and subjected to blacking treatment to form an inner layer circuit board, and then the inner layer circuit boards and the prepregs and/or resin sheets of the present embodiment are alternately disposed one by one. Further, copper foils are disposed on the outermost layers to laminate under the above conditions, preferably under vacuum, whereby a multilayer board can be manufactured. The metal foil-clad laminate of the present embodiment can be suitably used as a printed wiring board.

(Metal Foil)

The metal foil is not particularly limited, and examples include a gold foil, a silver foil, a copper foil, a tin foil, a nickel foil, and an aluminum foil. Of these, a copper foil is preferable. The copper foil is not particularly limited as long as it is generally used as a material for a printed wiring board, and examples include copper foils such as a rolled copper foil, and an electrolytic copper foil. Of these, an electrolytic copper foil is preferable, in view of copper foil peel strength and fine wiring formation. The thickness of a copper foil is not particularly limited and can be about 1.5 to 70 μm.

[Printed Wiring Board]

The printed wiring board of the present embodiment has an insulation layer and a conductor layer disposed on one side or each of both sides of the insulation layer, wherein the insulation layer contains a cured product of the resin composition of the present embodiment. The insulation layer preferably contains at least one of a layer formed of the resin composition of the present embodiment (the layer containing the cured product) and a layer formed of the prepreg (the layer containing the cured product). Such a printed wiring board can be produced according to a usual method, and the production method thereof is not particularly limited. For example, the printed wiring board can be produced by using the metal foil-clad laminate described above. Hereinafter, an example of the production method of the printed wiring board is described.

First, the metal foil-clad laminate described above is provided. Next, the surface of the metal foil-clad laminate is subjected to etching treatment to form an inner layer circuit, thereby manufacturing an inner layer substrate. The surface treatment for increasing the adhesive strength is carried out, as needed, on the inner layer circuit surface of this inner layer substrate, then the required number of sheets of the above prepregs are laminated on the inner layer circuit surface, further a metal foil for an outer layer circuit is laminated on the outside thereof, thereby integrating by heating and pressing. Thus, the multilayer laminate is produced in which the base material and the insulation layer consisting of the cured product of the resin composition of the present embodiment are formed between the inner layer circuit and the copper foil for the outer layer circuit. Subsequently, this multilayer laminate is subjected to drilling for a through-hole or a via hole, then a plated metal film is formed on the wall surface of this hole for conducting the inner layer circuit and the metal foil for the outer layer circuit, further the metal foil for the outer layer circuit is subjected to etching treatment to form the outer layer circuit, whereby the printed wiring board is produced.

The printed wiring board obtained in the above production example has the structure in which the insulation layer and the conductor layer formed on the surface of this insulation layer, wherein the insulation layer contains the cured product of the resin composition according to the present embodiment. That is, the prepreg according to the present embodiment (containing the base material and the cured product of the resin composition of the present embodiment penetrating or coating it) and the layer of the resin composition of the metal foil-clad laminate of the present embodiment (the layer containing the cured product of the resin composition of the present embodiment) are structured by the insulation layer containing the cured product of the resin composition of the present embodiment.
[Semiconductor Device]

The semiconductor device can be produced by mounting a semiconductor tip at a conductive point on the printed wiring board of the present embodiment. The conductive point herein refers to the point at which an electrical signal is transmitted in the multilayer printed wiring board, and such a place can be either on the surface or in an embedded point. Further, the semiconductor tip is not particularly limited as long as it is an electrical circuit element made of a semiconductor as a material.

The method for mounting a semiconductor tip when producing the semiconductor device is not particularly limited as long as the semiconductor tip effectively functions, and specifically examples include wire-bonding mounting method, flip-chip mounting method, bumpless build-up layer (BBUL) mounting method, anisotropic conductive film (ACE) mounting method, and non-conductive film (NCF) mounting method.

EXAMPLES

Hereinafter, the present embodiment will be more specifically described by way of examples and comparative examples. The present embodiment is not limited at all by the following examples.
[Measurement Method of Median Particle Size]

The median particle sizes (D50) of $BaTi_4O_9$ used as the raw material in Production Example 1, $BaTi_4O_9$ used in Comparative Examples, $BaTi_4O_9$ in the slurry obtained in Production Example 1, and the filler (spherical fused silica) were calculated by measuring a particle size distribution by the laser diffraction•scattering method under the following measurement conditions using a laser diffraction•scattering type particle size distribution analyzer (Microtrac MT3300EXII (product name), MicrotracBEL Corp.).
(Conditions for Measurement Using a Laser Diffraction•Scattering Type Particle Size Distribution Analyzer)

Solvent: methyl ethyl ketone, solvent refractive index: 1.33, particle refractive index: 2.41 ($BaTi_4O_9$), 1.45 (spherical fused silica), transmittance: 85±5%.

[Production Example 1] Production of $BaTi_4O_9$ (A) Slurry

To a 50 L-metal tank, barium titanate ($BaTi_4O_9$, median particle size (D50) 2.1 μm, BT-149 (product name), Nippon Chemical Industrial Co., Ltd.) was put, and methyl ethyl ketone was added in an amount of 40 mass % in terms of solid content. Subsequently, a wetting and dispersing agent (DISPERBYK (registered trademark)-2155 (product name), BYK Japan KK) was added to be 1 part by mass per 100 parts by mass of barium titanate (BT-149, product name) and the resultant was stirred at 350 rpm for 100 minutes using a stirrer (Three-One motor). To a continuous bead mill (NAM-20 (product name), AIMEX CO., Ltd.) whose pulverization chamber was filled with zirconia beads having a particle size of 0.2 mm in an amount of 60 vol % of a pulverization chamber capacity, the stirred solution was passed in a discharge amount of 8.5 L/min for 300 minutes, and stirred with zirconia beads in the pulverization chamber at a peripheral speed of 11 m/sec, thereby obtaining a slurry of $BaTi_4O_9$ (A). The concentration of $BaTi_4O_9$ (A) in the obtained slurry was 40 mass % in terms of solid content.

The median particle size of $BaTi_4O_9$ (A) in the obtained slurry was measured and consequently found that the median particle size (D50) was 0.33 μm.

[Synthesis Example 1] Synthesis of 1-Naphthol Aralkyl-Type Cyanate Ester Compound (SN495V-CN)

300 g of a 1-naphthol aralkyl-type phenolic resin (in terms of OH group 1.28 mol) (SN495V (product name), OH group (hydroxy group) equivalent: 236 g/eq., new Nippon Steel Chemical Co., Ltd.) and 194.6 g of triethylamine (1.92 mol) (1.5 mol based on 1 mol of hydroxy group) were dissolved in 1800 g of dichloromethane, and the resultant was designated as Solution 1. 125.9 g of cyanogen chloride (2.05 mol) (1.6 mol based on 1 mol of hydroxy group), 293.8 g of dichloromethane, 194.5 g of 36% hydrochloric acid (1.92 mol) (1.5 mol based on 1 mol of hydroxy group), and 1205.9 g of water were stirred while maintaining the solution temperature at −2 to −0.5° C., into which Solution 1 was pored over a period of 30 minutes. After completion of pouring Solution 1, the resulting solution was stirred at the same temperature for 30 minutes, and a solution in which 65 g of triethylamine (0.64 mol) (0.5 mol based on 1 mol of hydroxy group) was dissolved in 65 g of dichloromethane (Solution 2) was poured thereinto over a period of 10 minutes. After completion of pouring Solution 2, the resultant was stirred for 30 minutes at the same temperature, and the reaction was completed. Subsequently, the reaction liquid was allowed to stand for separating the organic phase and the aqueous phase, and the obtained organic phase was washed 5 times with 1300 g of water. An electrical conductivity of waste water at the 5th water-washing was 5 μS/cm, thereby confirming that ionic compounds removable by washing with water were sufficiently removed. The organic phase after washed with water was concentrated under reduced pressure and finally concentrated to dryness at 90° C. for 1 hour, thereby obtaining 331 g of the intended 1-naphthol aralkyl-type cyanate ester compound (SN495V-CN, cyanate ester group equivalent: 261 g/eq., $R^3$ in the above formula (1) are all hydrogen atoms, and n3 is an integer of 1 to 10) (orange color viscous substance). An infrared absorption spectrum of the obtained SN495V-CN showed the absorption at 2250 cm-1 (cyanate ester group), and did not show the absorption of hydroxy group.

Example 1

A resin varnish (solid content concentration of 50 mass %) was obtained by mixing 48 parts by mass of the 1-naphthol aralkyl-type cyanate ester compound (SN495V-CN) obtained in Synthesis Example 1, 16 parts by mass of 2,2-bis(4-(4-maleimidephenoxy)-phenyl)propane (BMI-80 (product name), K.I Chemical Industry Co., Ltd.), 16 parts by mass of a biphenyl aralkyl-type maleimide compound (MIR-3000-MT (product name), Nippon Kayaku Co., Ltd.), 20 parts by mass of a naphthylene ether-type epoxy resin (HP-6000 (product name), epoxy equivalent: 250 g/eq., DIC Corporation), 90 parts by mass (in terms of solid content) of the slurry of $BaTi_4O_9$ (A) obtained in Production Example 1 (solid content concentration of 40%), 19 parts by mass of spherical fused silica (median particle size (D50): 1.10 μm, SC4500-SQ (product name), Admatechs Company Limited, 3 parts by mass of a silane coupling agent (KBM-403 (product name), Shin-Etsu Chemical Co., Ltd.), 1 part by mass of a wetting and dispersing agent DISPERBYK (registered trademark)-161 (product name, BYK Japan KK), and 2 parts by mass of DISPERBYK (registered trademark)-111 (product name, BYK Japan KK) (total of the wetting and dispersing agents: 3 parts by mass). The blending ratio (content ratio) of $BaTi_4O_9$ (A) to the spherical fused silica in the resin varnish was 70:30 ($BaTi_4O_9$ (A):spherical fused silica) in a volume ratio.

The obtained resin varnish was allowed to penetrate and coat an E glass cloth and heated to dry at 160° C. for 10 minutes, thereby obtaining a prepreg having a thickness of 0.1 mm. Next, electrolytic copper foils (3EC-M3-VLP (product name), MITSUI MINING & SMELTING CO., LTD.) having a thickness of 12 μm were disposed on the upper and lower sides of the obtained prepreg, and laminated by vacuum pressing at a surface pressure of 30 kgf/cm$^2$ and a temperature of 220° C. for 120 minutes, thereby manufacturing a metal foil-clad laminate (a double-sided copper-clad laminated sheet) having a thickness of 0.1 mm. Physical properties of the obtained resin varnish and metal foil-clad laminate were measured in accordance with the evaluation methods to be described later, and the measurement results were shown in Table 1.

Example 2

A resin varnish (solid content concentration of 50 mass %) was obtained in the same manner as in Example 1 except that 29 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 60:40 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 1.

Example 3

A resin varnish (solid content concentration of 50 mass %) was obtained in the same manner as in Example 1 except that 40 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 52:48 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 1.

Example 4

A resin varnish (solid content concentration of 50 mass %) was obtained in the same manner as in Example 1 except that 80 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 35:65 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 1.

Example 5

A resin varnish (solid content concentration of 50 mass %) was obtained in the same manner as in Example 1 except that 103 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 31:69 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 1.

Example 6

A resin varnish (solid content concentration of 50 mass %) was obtained in the same manner as in Example 1 except that 180 parts by mass, in place of 90 parts by mass, of the slurry of $BaTi_4O_9$ (A) obtained in Production Example 1 was blended, and 80 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 52:48 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 1.

Example 7

A resin varnish (solid content concentration of 50 mass %) was obtained by mixing 48 parts by mass of the 1-naphthol aralkyl-type cyanate ester compound (SN495V-CN) obtained in Synthesis Example 1, 32 parts by mass of a biphenyl aralkyl-type maleimide compound (MIR-3000-MT (product name), Nippon Kayaku Co., Ltd.), 20 parts by mass of a naphthylene ether-type epoxy resin (HP-6000 (product name), epoxy equivalent: 250 g/eq., DIC Corporation), 90 parts by mass (in terms of solid content) of the slurry of $BaTi_4O_9$ (A) obtained in Production Example 1 (solid content concentration of 40%), 80 parts by mass of spherical fused silica (median particle size (D50): 1.10 μm, SC4500-SQ (product name), Admatechs Company Limited), 3 parts by mass of a silane coupling agent (KBM-403 (product name), Shin-Etsu Chemical Co., Ltd.), 1 part by mass of a wetting and dispersing agent DISPERBYK (registered trademark)-161 (product name, BYK Japan KK), and 2 parts by mass of DISPERBYK (registered trademark)-111 (product name, BYK Japan KK) (total of the wetting and dispersing agents: 3 parts by mass). The blending ratio (content ratio) of $BaTi_4O_9$ (A) to the spherical fused silica in the resin varnish was 35:65 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 1.

Example 8

A resin varnish (solid content concentration of 50 mass %) was obtained in the same manner as in Example 1 except that 20 parts by mass of a biphenyl aralkyl-type epoxy resin (NC-3000FH (product name), epoxy equivalent: 328 g/eq., Nippon Kayaku Co., Ltd.) was blended in place of 20 parts by mass of the naphthylene ether-type epoxy resin (HP-6000 (product name), epoxy equivalent: 250 g/eq., DIC Corporation), and 80 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 35:65 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 1.

Comparative Example 1

A resin varnish (solid content concentration of 50 mass %) was obtained in the same manner as in Example 4 except that 90 parts by mass of barium titanate ($BaTi_4O_9$, median particle size (D50) 2.08 μm, BT-149 (product name), Nippon Chemical Industrial Co., Ltd.) was blended, in place of 90 parts by mass of the slurry of $BaTi_4O_9$ (A) obtained in Production Example 1. The blending ratio (content ratio) of the barium titanate to the spherical fused silica in the resin varnish was 35:65 (barium titanate:spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 2.

Comparative Example 2

A resin varnish (solid content concentration of 50 mass %) was obtained by mixing 48 parts by mass of the 1-naphthol aralkyl-type cyanate ester compound (SN495V-CN) obtained in Synthesis Example 1, 16 parts by mass of 2,2-bis(4-(4-maleimidephenoxy)-phenyl)propane (BMI-80 (product name), K.I Chemical Industry Co., Ltd.), 16 parts by mass of a biphenyl aralkyl-type maleimide compound (MIR-3000-MT (product name), Nippon Kayaku Co., Ltd.), 20 parts by mass of a naphthylene ether-type epoxy resin (HP-6000 (product name), epoxy equivalent: 250 g/eq., DIC Corporation), 80 parts by mass of spherical fused silica (median particle size (D50): 1.10 μm, SC4500-SQ (product name), Admatechs Company Limited), 3 parts by mass of a silane coupling agent (KBM-403 (product name), Shin-Etsu Chemical Co., Ltd.), 1 part by mass of a wetting and dispersing agent DISPERBYK (registered trademark)-161 (product name, BYK Japan KK), and 2 parts by mass of DISPERBYK (registered trademark)-111 (product name, BYK Japan KK) (total of the wetting and dispersing agents: 3 parts by mass).

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 2.

Comparative Example 3

A resin varnish (solid content concentration of 50 mass %) was obtained by mixing 48 parts by mass of the 1-naphthol aralkyl-type cyanate ester compound (SN495V-CN) obtained in Synthesis Example 1, 16 parts by mass of 2,2-bis(4-(4-maleimidephenoxy)-phenyl)propane (BMI-80 (product name), K.I Chemical Industry Co., Ltd.), 16 parts by mass of a biphenyl aralkyl-type maleimide compound (MIR-3000-MT (product name), Nippon Kayaku Co., Ltd.), 20 parts by mass of a naphthylene ether-type epoxy resin (HP-6000 (product name), epoxy equivalent: 250 g/eq., DIC Corporation), 90 parts by mass (in terms of solid content) the slurry of $BaTi_4O_9$ (A) obtained in Production Example 1 (solid content concentration of 40%), 3 parts by mass of a silane coupling agent (KBM-403 (product name), Shin-Etsu Chemical Co., Ltd.), 1 part by mass of a wetting and dispersing agent DISPERBYK (registered trademark)-161 (product name, BYK Japan KK), and 2 parts by mass of DISPERBYK (registered trademark)-111 (product name, BYK Japan KK) (total of the wetting and dispersing agents: 3 parts by mass).

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 2.

Comparative Example 4

A resin varnish (solid content concentration of 50 mass %) was obtained in the same manner as in Example 1 except that 10 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 81:19 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 2.

Comparative Example 5

A resin varnish (solid content concentration of 50 mass %) was obtained in the same manner as in Example 1 except that 280 parts by mass, in place of 19 parts by mass, of the spherical fused silica (SC4500-SQ (product name)) was blended. The blending ratio (content ratio) of $BaTi_4O_9$ (A) to the spherical fused silica in the resin varnish was 14:86 ($BaTi_4O_9$ (A):spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 2.

Comparative Example 6

A resin varnish (solid content concentration of 50 mass %) was obtained in the same manner as in Example 4 except that 180 parts by mass of barium titanate ($BaTi_4O_9$, median particle size (D50) 2.08 μm, BT-149 (product name), Nippon Chemical Industrial Co., Ltd.) was blended, in place of 90 parts by mass of the slurry of $BaTi_4O_9$ (A) obtained in Production Example 1. The blending ratio (content ratio) of the barium titanate to the spherical fused silica in the resin varnish was 52:48 (barium titanate:spherical fused silica) in a volume ratio.

Using the obtained resin varnish, a metal foil-clad laminate (a double-sided copper-clad laminated sheet) was manufactured in the same manner as in Example 1. Physical properties of the obtained resin varnish and metal foil-clad laminate were measured in accordance with the evaluation methods to be described later, and the measurement results were shown in Table 2.

Evaluation Methods (1) Evaluation of the Resin Varnishes (Measurement of Resin Curing Time)

The resin varnishes obtained in Examples and Comparative Examples were injected into a tester (Auto Gel Time Tester MADOKA (product name), Matsuo Sangyo Co., Ltd.) using a micropipette and the time (second) taken to cure the resin was measured under the following measurement conditions.

(Measurement Conditions)

Heated plate temperature: 170° C., torque judgment value: 15%, rotation speed: 190 rpm, revolution speed: 60 rpm, gap value: 0.3 mm, average point: 50, amount injected: 500 μL.

(2) Evaluation of the Metal Foil-Clad Laminates (Appearance Evaluation)

All the copper foils on both sides of the metal foil-clad laminates obtained in Examples and Comparative Examples were etched, thereby obtaining unclad laminates from which all the copper foils on both sides were removed. Both sides of these unclad laminates were visually observed. Those with no irregularities on both sides were rated as "A", and those with irregularities on at least either one of both sides were rated as "C".

(Glass Transition Temperature (Tg))

All the copper foils on both sides of the metal foil-clad laminates obtained in Examples and Comparative Examples were etched, thereby obtaining unclad laminates from which all the copper foils on both sides were removed. The unclad laminate was cut (downsized) to a size of 40 mm×4.5 mm, thereby obtaining a sample for measurement. On this sample for measurement, the glass transition temperature (Tg, ° C.) was measured by the DMA method in accordance with JIS C6481 using a dynamic mechanical analyzer (0800 (product name), TA Instruments).

(Coefficient of Thermal Expansion (CTE))

All the copper foils on both sides of the metal foil-clad laminates obtained in Examples and Comparative Examples were etched, thereby obtaining unclad laminates from which all the copper foils on both sides were removed. The unclad laminate was cut (downsized) to a size of 40 mm×4.5 mm, thereby obtaining a sample for measurement. On this sample for measurement, the coefficient of thermal expansion (CTE, ppm/° C.) from 60° C. to 120° C. was measured in accordance with JIS C6481 using a thermomechanical analyzer (0400 (product name), TA Instruments) in a rate of temperature increase of 10° C. per minute from 40° C. to 340° C.

(Relative Permittivity (Dk) and Dissipation Factor (Df))

All the copper foils on both sides of the metal foil-clad laminates obtained in Examples and Comparative Examples were etched, thereby obtaining unclad laminates from which all the copper foils on both sides were removed. The unclad laminate was cut (downsized) to a size of 100 mm×100 mm, thereby obtaining a sample for measurement. On this sample for measurement, the relative permittivity (Dk) and dissipation factor (Df) at 40 GHz were measured using an open resonator (Fabry-Perot resonator DPS03 (product name), KEYCOM Corporation). The measurement for the relative permittivity (Dk) and dissipation factor (Df) were carried out in the environment at a temperature of 23° C.±1° C. and a humidity of 50% RH±5% RH.

TABLE 1

| | | Example 1 | Example 2 | Example 3 | Example 4 | Example 5 | Example 6 | Example 7 | Example 8 |
|---|---|---|---|---|---|---|---|---|---|
| Physical properties | Resin-curing time (sec) | 703 | 650 | 834 | 667 | 430 | 224 | 485 | 450 |
| | Appearance evaluation | A | A | A | A | A | A | A | A |
| | Glass transition temperature (Tg, ° C.) | 291 | 290 | 285 | 287 | 282 | 244 | 288 | 275 |
| | Coefficient of thermal expansion (CTE, ppm/° C.) | 9.8 | 9.7 | 9.7 | 8.9 | 7.9 | 9.5 | 8.6 | 8.8 |
| | Relative permittivity (Dk, 40 GHz) | 5.3 | 5.2 | 5.1 | 5.1 | 4.9 | 5.7 | 4.9 | 5.1 |
| | Dissipation factor (Df, 40 GHz) | 0.0107 | 0.0102 | 0.0101 | 0.0096 | 0.0094 | 0.0092 | 0.0097 | 0.0094 |

TABLE 2

|  |  | Comparative Example 1 | Comparative Example 2 | Comparative Example 3 | Comparative Example 4 | Comparative Example 5 | Comparative Example 6 |
|---|---|---|---|---|---|---|---|
| Physical properties | Resin-curing time (sec) | 1564 | 863 | 971 | 1224 | 47 | 987 |
|  | Appearance evaluation | C | A | A | A | C | C |
|  | Glass transition temperature (Tg, °C.) | 292 | 300 | 288 | 296 | 269 | 278 |
|  | Coefficient of thermal expansion (CTE, ppm/°C.) | 10.4 | 9.4 | 9.8 | 10.0 | 6.8 | 9.3 |
|  | Relative permittivity (Dk, 40 GHz) | 5.1 | 4.3 | 5.4 | 5.3 | 4.3 | 5.6 |
|  | Dissipation factor (Df, 40 GHz) | 0.0092 | 0.0095 | 0.0110 | 0.0108 | 0.0081 | 0.0088 |

The present application claims priority to the Japanese Patent Application 2021-020067 filed in Japan Patent Office on Feb. 10, 2021, the contents of which are incorporated herein by reference.

INDUSTRIAL APPLICABILITY

The resin composition of the present invention has a high permittivity and a low dissipation factor, and has a low coefficient of thermal expansion and a good appearance. For this reason, the resin composition of the present invention, for example, can be suitably used as a raw material for a cured product, a prepreg, a film-like underfill material, a resin sheet, a laminate, a build-up material, a non-conductive film, a metal foil-clad laminate, a printed wiring board, and a fiber-reinforced composite material, or for producing a semiconductor device.

The invention claimed is:

1. A resin composition, comprising:
(A) $BaTi_4O_9$,
(B) a filler different from the $BaTi_4O_9$ (A), and
(C) a thermosetting resin,
wherein a median particle size, D50, of the $BaTi_4O_9$ (A) is 0.10 to 1.00 μm,
a median particle size, D50, of the filler (B) is 0.10 to 10.00 μm,
the filler (B) comprises silica,
a volume ratio of the $BaTi_4O_9$ (A) to the filler (B), the $BaTi_4O_9$ (A): the filler (B), ranges from 15:85 to 80:20, and
the thermosetting resin (C) comprises one or more selected from the group consisting of a maleimide compound, a cyanate ester compound, and an epoxy compound.

2. The resin composition according to claim 1, wherein the filler (B) further comprises one or more selected from the group consisting of alumina, calcium titanate, strontium titanate, aluminum nitride, boron nitride, boehmite, aluminum hydroxide, silicone rubber powder, and silicone composite powder.

3. The resin composition according to claim 1, wherein a total content of the $BaTi_4O_9$ (A) and the filler (B) is 100 to 300 parts by mass based on 100 parts by mass of the resin solid content in the resin composition.

4. The resin composition according to claim 1, wherein the thermosetting resin (C) further comprises one or more selected from the group consisting of phenolic compounds, alkenyl-substituted nadiimide compounds, oxetane resins, benzoxazine compounds, and compounds having a polymerizable unsaturated group.

5. The resin composition according to claim 1, wherein the thermosetting resin (C) comprises the cyanate ester compound, the cyanate ester compound comprising one or more selected from the group consisting of phenol novolac-type cyanate ester compounds, naphthol aralkyl-type cyanate ester compounds, naphthylene ether-type cyanate ester compounds, xylene resin-type cyanate ester compounds, bisphenol M-type cyanate ester compounds, bisphenol A-type cyanate ester compounds, diallyl bisphenol A-type cyanate ester compounds, bisphenol E-type cyanate ester compounds, bisphenol F-type cyanate ester compounds, and biphenyl aralkyl-type cyanate ester compounds, and prepolymers or polymers of these cyanate ester compounds.

6. The resin composition according to claim 1, wherein the thermosetting resin (C) comprises the maleimide compound, the maleimide compound comprising one or more selected from the group consisting of bis (4-maleimidephenyl) methane, 2,2-bis (4-(4-maleimidephenoxy)-phenyl) propane, bis (3-ethyl-5-methyl-4-maleimidephenyl) methane, maleimide compounds represented by the following formula (2), maleimide compounds represented by the following formula (3) and maleimide compounds represented by the following formula (4):

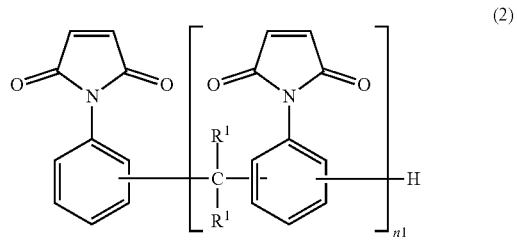

wherein $R^1$ each independently represents a hydrogen atom or a methyl group, and n1 is an integer of 1 to 10,

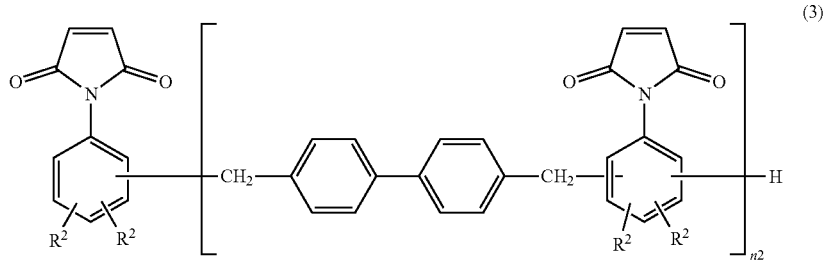
(3)

wherein $R^2$ each independently represents a hydrogen atom, an alkyl group having 1 to 5 carbon atoms, or a phenyl group, n2 is an average value and represents $1<n2\leq5$,

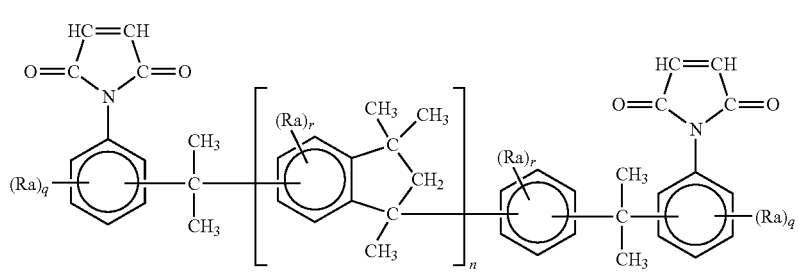
(4)

wherein Ra each independently represents a hydrogen atom, an alkyl group, an alkyloxy group, or an alkylthio group, each having 1 to 10 carbon atoms, an aryl group, an aryloxy group, or an arylthio group, each having 6 to 10 carbon atoms, a cycloalkyl group having 3 to 10 carbon atoms, a halogen atom, a nitro group, a hydroxy group, or a mercapto group; q represents an integer of 0 to 4, and when q is an integer of 2 to 4, Ra is the same or different in the same ring; Rb each independently represents a hydrogen atom, an alkyl group, an alkyloxy group, or an alkylthio group, each having 1 to 10 carbon atoms, an aryl group, an aryloxy group, or an arylthio group, each having 6 to 10 carbon atoms, a cycloalkyl group having 3 to 10 carbon atoms, a halogen atom, a hydroxy group, or a mercapto group; r represents an integer of 0 to 3, and when r is 2 or 3, Rb is the same or different in the same ring; and n is an average number of repeat units and represents a value of 0.95 to 10.0.

7. The resin composition according to claim 4, wherein the epoxy compound comprises one or more selected from the group consisting of biphenyl aralkyl-type epoxy resins, naphthalene-type epoxy resins, naphthylene ether-type epoxy resins, and butadiene skeleton-containing epoxy resins.

8. The resin composition according to claim 1, for use in a printed wiring board.

9. A prepreg, comprising:
a base material, and
the resin composition according to claim 1 penetrating or coating the base material.

10. A resin sheet comprising the resin composition according to claim 1.

11. A laminate comprising one or more selected from the group consisting of:
the prepreg according to claim 9, and
a resin sheet comprising a resin composition comprising:
(A) $BaTi_4O_9$,
(B) a filler different from the $BaTi_4O_9$ (A), and
(C) a thermosetting resin,
wherein:
a median particle size of the $BaTi_4O_9$ (A) is 0.10 to 1.00 μm,
a median particle size, D50, of the filler (B) is 0.10 to 10.00 μm,
the filler (B) comprises silica,
a volume ratio of the $BaTi_4O_9$ (A) to the filler (B), the $BaTi_4O_9$ (A): the filler (B), ranges from 15:85 to 80:20, and
the thermosetting resin (C) comprises one or more selected from the group consisting of maleimide compounds, cyanate ester compounds, and epoxy compounds.

12. A metal foil-clad laminate, comprising:
the laminate according to claim 11, and
a metal foil disposed on one side or each of both sides of the laminate.

13. A printed wiring board, comprising:
an insulation layer, and
a conductor layer disposed on one side or each of both sides of the insulation layer,
wherein the insulation layer comprises a cured product of the resin composition according to claim 1.

* * * * *